US009862914B2

(12) United States Patent
Kajikawa et al.

(10) Patent No.: US 9,862,914 B2
(45) Date of Patent: Jan. 9, 2018

(54) CLEANING AGENT FOR SEMICONDUCTOR SUBSTRATES AND METHOD FOR PROCESSING SEMICONDUCTOR SUBSTRATE SURFACE

(71) Applicant: WAKO PURE CHEMICAL INDUSTRIES, LTD., Osaka-shi, Osaka (JP)

(72) Inventors: Takayuki Kajikawa, Kawagoe (JP); Kohei Hayashi, Kawagoe (JP); Hironori Mizuta, Kawagoe (JP); Tsutomu Watahiki, Kawagoe (JP)

(73) Assignee: WAKO PURE CHEMICAL INDUSTRIES, LTD., Osaka-shi (JP)

( * ) Notice: Subject to any disclaimer, the term of this patent is extended or adjusted under 35 U.S.C. 154(b) by 0 days.

(21) Appl. No.: 15/035,146

(22) PCT Filed: Nov. 7, 2014

(86) PCT No.: PCT/JP2014/079651
§ 371 (c)(1),
(2) Date: May 6, 2016

(87) PCT Pub. No.: WO2015/068823
PCT Pub. Date: May 14, 2015

(65) Prior Publication Data
US 2016/0272924 A1 Sep. 22, 2016

(30) Foreign Application Priority Data
Nov. 8, 2013 (JP) .................................. 2013-231989

(51) Int. Cl.
| | | |
|---|---|---|
| *C11D 7/50* | (2006.01) | |
| *C11D 11/00* | (2006.01) | |
| *H01L 21/02* | (2006.01) | |
| *C11D 7/32* | (2006.01) | |
| *C11D 7/26* | (2006.01) | |
| *C11D 7/34* | (2006.01) | |
| *H01L 21/321* | (2006.01) | |
| *H01L 21/768* | (2006.01) | |
| *H01L 23/532* | (2006.01) | |

(52) U.S. Cl.
CPC .......... *C11D 11/0047* (2013.01); *C11D 7/261* (2013.01); *C11D 7/265* (2013.01); *C11D 7/32* (2013.01); *C11D 7/3209* (2013.01); *C11D 7/3218* (2013.01); *C11D 7/3281* (2013.01); *C11D 7/34* (2013.01); *H01L 21/02074* (2013.01); *H01L 21/3212* (2013.01); *H01L 21/7684* (2013.01); *H01L 23/53238* (2013.01)

(58) Field of Classification Search
CPC ................................................. C11D 11/0047
See application file for complete search history.

(56) References Cited

U.S. PATENT DOCUMENTS

| | | | | |
|---|---|---|---|---|
| 6,524,376 | B2 * | 2/2003 | Aoki ...................... | C09G 1/02 106/14.41 |
| 7,399,365 | B2 * | 7/2008 | Aoyama ................. | C11D 7/08 134/2 |
| 7,572,758 | B2 * | 8/2009 | Shimada ................ | C11D 3/042 252/79.4 |
| 7,700,533 | B2 * | 4/2010 | Egbe ..................... | C11D 7/3263 510/175 |
| 7,947,637 | B2 * | 5/2011 | Kneer ..................... | C11D 1/54 134/1.3 |
| 7,998,914 | B2 * | 8/2011 | Shimada ................ | C11D 3/30 134/2 |
| 2004/0244300 | A1 | 12/2004 | Ichiki et al. | |
| 2005/0014667 | A1 * | 1/2005 | Aoyama ................. | C11D 7/08 510/175 |
| 2005/0205835 | A1 * | 9/2005 | Tamboli ................. | C11D 3/2086 252/79.1 |
| 2006/0040838 | A1 * | 2/2006 | Shimada ................ | C11D 3/042 510/175 |
| 2006/0293208 | A1 * | 12/2006 | Egbe ..................... | C11D 7/3263 510/407 |
| 2007/0235061 | A1 | 10/2007 | Mizuta et al. | |
| 2008/0004197 | A1 * | 1/2008 | Kneer ..................... | C11D 1/54 510/245 |

(Continued)

FOREIGN PATENT DOCUMENTS

| | | |
|---|---|---|
| JP | 2002-359223 A | 12/2002 |
| JP | 2005-14206 A | 1/2005 |

(Continued)

OTHER PUBLICATIONS

International Search Report dated Dec. 16, 2014, issued in counterpart International Application No. PCT/JP2014/079651 (2 pages).

*Primary Examiner* — Gregory E Webb
(74) *Attorney, Agent, or Firm* — Westerman, Hattori, Daniels & Adrian, LLP

(57) ABSTRACT

The present invention relates to a cleaning agent for a semiconductor substrate having a copper wiring film or a copper alloy wiring film, and a cobalt-containing film to be used in a post-process of a chemical mechanical polishing process, comprising (A) an organic acid represented by general formula described in the present specification, (B) amines selected from the group consisting of (B-1) diamines, (B-2) amidines, (B-3) azoles, and (B-4) pyrazines or pyrimidines, represented by general formulae described in the present specification, (C) a hydroxylamine derivative, and (D) an oxygen scavenger represented by general formula described in the present specification, and being an aqueous solution having a pH of 10 or higher; and a processing method for the surface of a semiconductor substrate, having a copper wiring film or a copper alloy wiring film, and a cobalt-containing film, which comprises using the cleaning agent.

17 Claims, 2 Drawing Sheets

(56) References Cited

U.S. PATENT DOCUMENTS

| | | | |
|---|---|---|---|
| 2008/0047592 | A1 | 2/2008 | Fisher et al. |
| 2009/0081865 | A1 | 3/2009 | Isono |
| 2009/0099051 | A1* | 4/2009 | Aoyama ................ C11D 7/08 510/176 |
| 2010/0056409 | A1 | 3/2010 | Walker et al. |
| 2010/0152085 | A1* | 6/2010 | Shimada ................ C11D 3/30 510/175 |
| 2012/0000485 | A1 | 1/2012 | Mizuta et al. |
| 2013/0261040 | A1 | 10/2013 | Kawada et al. |
| 2016/0254139 | A1* | 9/2016 | Kamimura ........ H01L 21/31133 |
| 2016/0272924 | A1* | 9/2016 | Kajikawa .......... H01L 21/02074 |

FOREIGN PATENT DOCUMENTS

| | | |
|---|---|---|
| JP | 2007-525836 A | 9/2007 |
| JP | 2007-291505 A | 11/2007 |
| JP | 2008-543060 A | 11/2008 |
| JP | 2009-55020 A | 3/2009 |
| JP | 2009-76615 A | 4/2009 |
| JP | 2010-174074 A | 8/2010 |
| JP | 2010-527405 A | 8/2010 |
| JP | 2010-235725 A | 10/2010 |
| JP | 2011-205011 A | 10/2011 |
| JP | 2012-186470 A | 9/2012 |
| WO | 2005/040324 A1 | 5/2005 |
| WO | 2005/085408 A1 | 9/2005 |
| WO | 2006/127885 A1 | 11/2006 |
| WO | 2008/144501 A2 | 11/2008 |
| WO | 2011/094568 A2 | 8/2011 |
| WO | 2012/073909 A1 | 6/2012 |

* cited by examiner

[Figure 1]
[Figure 2]
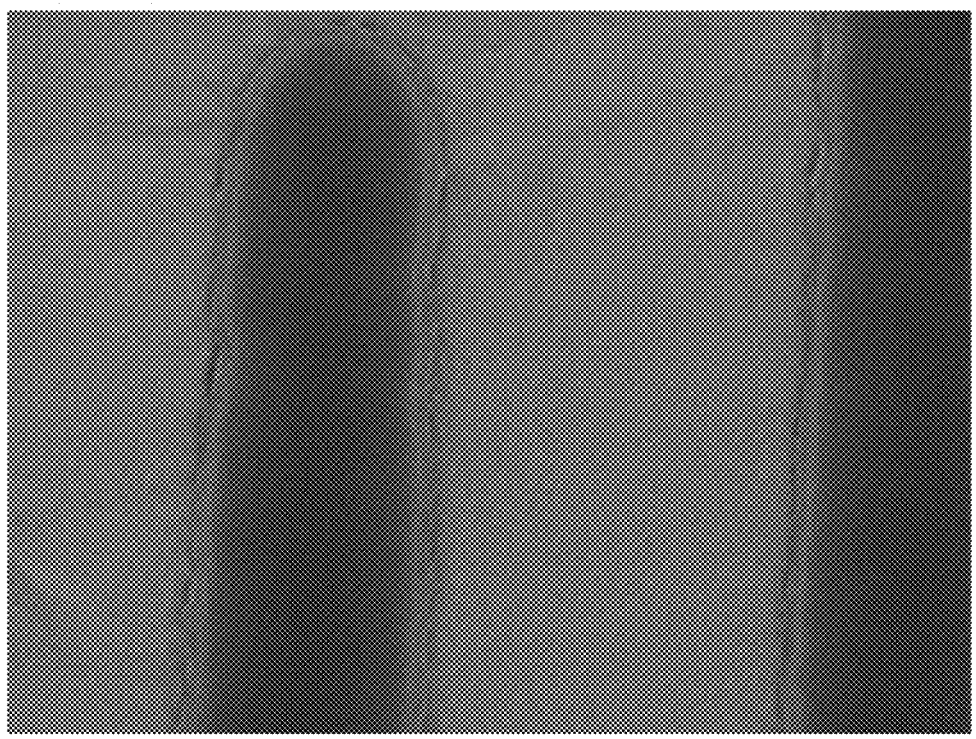

[Figure 3]
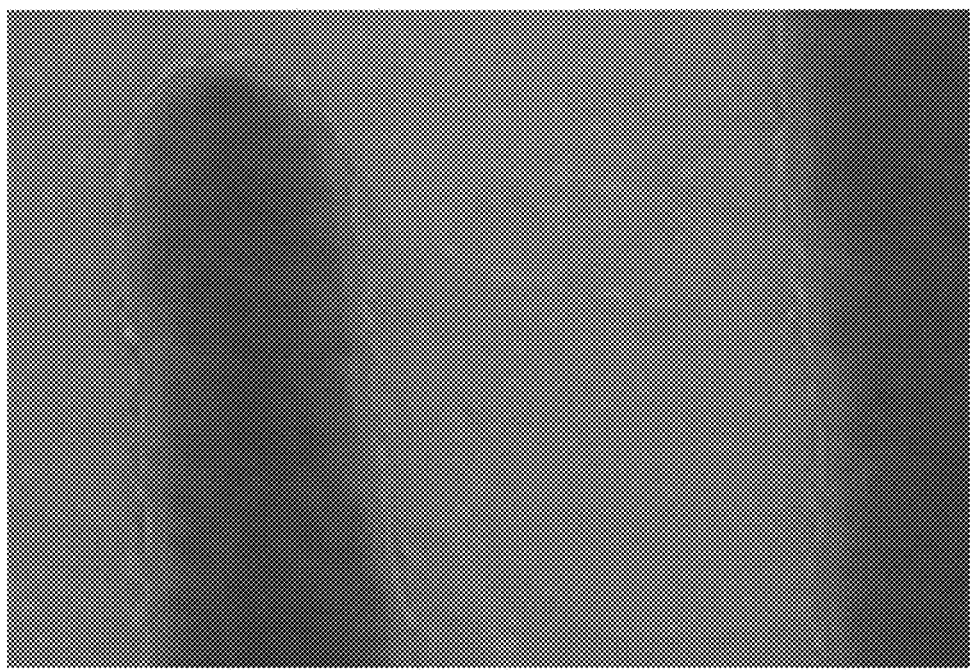

CLEANING AGENT FOR SEMICONDUCTOR SUBSTRATES AND METHOD FOR PROCESSING SEMICONDUCTOR SUBSTRATE SURFACE

TECHNICAL FIELD

The present invention relates to a cleaning agent to be used in a post-process of a chemical mechanical polishing (hereafter it may be abbreviated as CMP) process in a manufacturing process of a semiconductor substrate, and more specifically to a cleaning agent for a semiconductor substrate having a copper wiring film or a copper alloy wiring film, and a cobalt-containing film at the surface of the semiconductor substrate, and a processing method for the surface of a semiconductor substrate.

BACKGROUND ART

A development has been progressing to attain a finer and a higher integration of a semiconductor device typified by a silicon semiconductor, depending on market needs for higher performance, compact sizing and the like. Accompanying with the finer and the higher integration, such a semiconductor substrate has been required that has a damascene interconnect which is capable of correspond to a fine wiring pattern. Usually, as for the damascene interconnect, copper, an aluminum alloy or the like is used as a wiring material, and titanium, titanium nitride, tantalum, tantalum nitride or the like is used as a barrier metal material.

In formation of such a damascene interconnect, a CMP process is carried out for planarization of the surface of a substrate (a wafer) having, for example, a metal wiring film, a barrier metal, an insulating film or the like, by using polishing slurry containing fine polishing particles, for example, silica, alumina and the like. In the CMP process, fine polishing particles, such as silica, alumina and the like, to be used in the CMP process, a wiring metal film polished, metal impurities (metal residues) derived from a barrier metal or the like, tend to remain at the surface of a semiconductor substrate (a wafer) after polishing. These residues influence adversely on electric characteristics of a semiconductor, such as short circuit between wirings, therefore as a post-process of the CMP process, a cleaning process is carried out to remove these residues from the surface of the semiconductor substrate (the wafer).

On the other hand, in carrying out the CMP process, suppression of generation of polishing residue of the metal wiring film, scratch or dishing, or the like is carried out, while preventing excessive polishing of the wiring film, by adding, for example, benzotriazoles (hereafter they may be abbreviated as BTAs), to form a coating film (a protecting film) containing an anticorrosive such as BTA or the like at the surface of the metal wiring film. Such a coating film (a protecting film) is necessary to be removed finally, in the manufacturing process of the semiconductor substrate, therefore, recently removal of residues of fine polishing particles (particles), metal impurities (metal residues) or the like is carried out at the cleaning process after the CMP process, as well as removal of these coating films is also carried out.

As the cleaning agent after CMP to be used in such a cleaning process, there have been known conventionally a cleaning solution containing at least one kind of an organic alkali (for example, PATENT LITERATURE 1), a cleaning agent for a substrate, containing an organic acid having at least one carboxyl group and/or a chelating agent, and a specific organic solvent (for example, PATENT LITERATURE 2), a cleaning agent for a copper wiring, containing a copper corrosion suppressing agent and water (for example, PATENT LITERATURE 3), a cleaning composition for a semiconductor workpiece, containing a ammonium hydroxide compound, a chelating agent and an anticorrosive compound (for example, PATENT LITERATURE 4), an alkaline aqueous cleaning composition, containing at least one kind of an amine and at least one kind of a deactivator (for example, PATENT LITERATURE 5), a cleaning agent for a copper wiring semiconductor, containing a quaternary ammonium hydroxide, an amine and the like (for example, PATENT LITERATURE 6), a cleaning composition, containing at least one kind of a solvent, at least one kind of an anticorrosive and at least one kind of an amine (for example, PATENT LITERATURE 7), a cleaning agent for a copper wiring semiconductor, containing a specific cyclic (poly)amine and a polyphenol-type reducing agent having 2 to 5 hydroxyl groups (for example, PATENT LITERATURES 8, 9), a cleaning agent for a copper wiring semiconductor, containing a specific amine, a specific polyphenol compound and the like (for example, PATENT LITERATURE 10), a cleaning agent for a copper wiring substrate, containing a specific amino acid and an alkylhydroxylamine (for example, PATENT LITERATURE 11) or the like.

In recent years, a development has been progressing to attain a still finer wiring, and there has been required a thin film-type barrier metal, accompanying with the finer wiring. However, titanium or tantalum, which has conventionally been used as a barrier metal, is difficult to prepare a fine thin film, and has been known to deteriorate barrier characteristics for preventing diffusion of a metal of a wiring material, caused by making a thin film. Accordingly use of metallic cobalt has been investigated as a new barrier metal material (for example, PATENT LITERATURE 12).

CITATION LIST

Patent Literature

PATENT LITERATURE 1: JP-A-2002-359223
PATENT LITERATURE 2: WO20051040324
PATENT LITERATURE 3: JP-A-2007-291505
PATENT LITERATURE 4: JP-A-2007-525836
PATENT LITERATURE 5: JP-A-2008-543060
PATENT LITERATURE 6: JP-A-2010-174074
PATENT LITERATURE 7: JP-A-2010-527405
PATENT LITERATURE 8: JP-A-2010-235725
PATENT LITERATURE 9: JP-A-2011-205011
PATENT LITERATURE 10: JP-A-2012-186470
PATENT LITERATURE 11: WO2012/073909
PATENT LITERATURE 12: JP-A-2009-76615

SUMMARY OF INVENTION

Technical Problem

In the case of using a metallic cobalt as a banier metal material, and copper or a copper alloy as a wiring metal, copper (I) oxide is formed by oxidation of the surface of a metallic copper which forms a wiring, in a CMP process, as well as cobalt (II) oxide is formed by oxidation of the surface of a barrier metal mainly composed of cobalt. It has been understood that by carrying out cleaning after CMP using, for example, the cleaning agents (cleaning solutions) or the cleaning compositions of PATENT LITERATURES 1 to 11, to the semiconductor substrate in such a state, the barrier metal mainly composed of cobalt is corroded, by generation of bimetallic corrosion (galvanic corrosion) at a contact part of copper (I) oxide and cobalt (II) oxide present at the surface of the semiconductor substrate, and current leak phenomenon is generated, by which copper derived from the copper wiring diffuses in an insulating film. In a conventional semiconductor substrate, even if a part of copper (I) oxide and cobalt (II) oxide is corroded, caused by generation of bimetallic corrosion (galvanic corrosion), it has not been a serious problem, because line width of the wiring and the barrier metal were not so fine. However, in the case of using cobalt, which is chemically easy to dissolve, as a barrier metal, and using copper or the copper alloy as a wiring metal, depending on recent needs for a still more finer wiring, it has been understood that corrosion of the barrier metal, caused by bimetallic corrosion (galvanic corrosion), raises a serious problem. Under such background, a development of such a cleaning agent has been desired, that not only has cleaning performance conventionally provided with as a cleaning agent to be used in the cleaning process after the CMP process, but also little causes bimetallic corrosion (galvanic corrosion) of copper (I) oxide and cobalt (II) oxide, formed in the CMP process.

The present invention has been made in view of the above-described circumstances, and an object of the present invention is to provide a cleaning agent to be used for a semiconductor substrate having a copper wiring film or a copper alloy wiring film, and a cobalt-containing film, which is superior in removability of fine polishing particles (particles), such as silica, alumina and the like, and metal impurities (metal residues), remaining at the surface of a semiconductor substrate (a wafer) after a CMP process; and is capable of removing a coating film (a protecting film) containing an anticorrosive such as BTA or the like, formed at the surface of the copper wiring film or the surface of the copper aloy wiring film; and does not remove a metal oxide composed of copper (I) oxide exposed at the surface of the substrate after removing the coating film (the protecting film) containing the anticorrosive; and still more, little generates bimetallic corrosion (galvanic corrosion) of copper (I) oxide at the surface of the copper wiring film or the surface of the copper alloy wiring film, and cobalt (II) oxide formed at the surface of a barrier metal mainly composed of, for example, cobalt; and a processing method for the surface of a semiconductor substrate.

Solution to Problem

The present invention is an invention of a cleaning agent for a semiconductor substrate having a copper wiring film or a copper alloy wiring film, and a cobalt-containing film to be used in a post-process of a chemical mechanical polishing process, comprising (A) an organic acid represented by general formula (1), (B) amines selected from the group consisting of (B-1) diamines represented by general formula (2), (B-2) amidines represented by general formula (3), (B-3) azoles represented by general formula (4), and (B-4) pyrazines or pyrimidines represented by general formula (5), (C) a hydroxylamine derivative, and (D) an oxygen scavenger represented by general formula (6); and being an aqueous solution having a pH of 10 or higher:

(1)

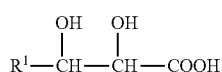

wherein $R^1$ represents a carboxyl group, a 1,2,3-trihydroxypropyl group or a 3-oxo-1,2-dihydroxypropyl group;

(2)

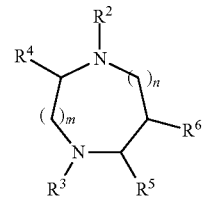

wherein $R^2$ and $R^3$ each independently represent a hydrogen atom, an alkyl group having 1 to 4 carbon atoms or an aryl group having 6 to 10 carbon atoms, R4 represents a hydrogen atom, a hydroxyl group or an alkyl group having 1 to 4 carbon atoms which may have a hydroxyl group, $R^5$ and $R^6$ each independently represent a hydrogen atom or an alkyl group having 1 to 4 carbon atoms, $R^2$ and $R^3$, $R^3$ and $R^6$, or $R^4$ and $R^6$ may form an alkylene chain having 1 to 3 carbon atoms, m represents 0 or 1, and n represents an integer of 0 to 2;

(3)

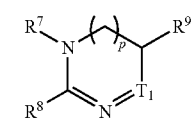

wherein $R^7$ represents an alkyl group having 1 to 4 carbon atoms, $R^8$ represents an amino group, $R^7$ and $R^8$ may form an alkylene chain having 3 to 6 carbon atoms, $R^9$ represents a hydrogen atom or an alkyl group having 1 to 4 carbon atoms, $T_1$ represents a —$CH_2$— group or a —C(=O)— group, and p represents 0 or 1;

(4)

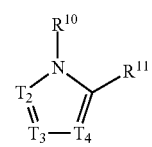

wherein $R^{10}$ represents a hydrogen atom or an alkyl group having 1 to 4 carbon atoms, $R^{11}$ represents a hydrogen atom, a mercapto group, an amino group, an alkyl group having 1 to 4 carbon atoms or a 2-imidazolyl group, $T_2$ represents a nitrogen atom or a —C(—$R^{12}$)— group, wherein $R^{12}$ represents a hydrogen atom or an alkyl group having 1 to 4 carbon atoms, $T_3$ represents a nitrogen atom or a —C(—$R^{13}$)— group, wherein $R^{13}$ represents a hydrogen atom, a hydroxyl group or an alkyl group having 1 to 4 carbon atoms which may have an amino group, T4 represents a nitrogen atom or a —CH— group, provided that at least one of $T_2$ and T4 represents a nitrogen atom;

(5)

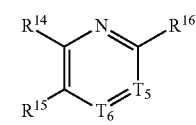

wherein $R^{14}$ to $R^{16}$ each independently represent a hydrogen atom, a hydroxyl group or an alkyl group having 1 to 4 carbon atoms which may have an amino group or a hydroxyl group, $T_5$ represents a nitrogen atom or a —C(—$R^{17}$)— group, wherein $R^{17}$ represents a hydrogen atom, a hydroxyl group or an alkyl group having 1 to 4 carbon atoms which may have an amino group or a hydroxyl group, $T_6$ represents a nitrogen atom or a —C(—$R^{18}$)— group, wherein $R^{18}$ represents a hydrogen atom, a hydroxyl group or an alkyl group having 1 to 4 carbon atoms which may have an amino group or a hydroxyl group, provided that at least one of $T_5$ and $T_6$ represents a nitrogen atom;

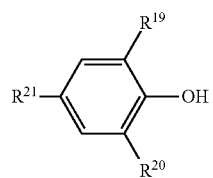

(6)

wherein $R^{19}$ represents a hydrogen atom or a hydroxyl group, $R^{20}$ represents a hydrogen atom or a hydroxyl group, $R^{21}$ represents a hydrogen atom, a hydroxyl group, a carboxyl group or a propoxycarbonyl group, provided that at least one of $R^{19}$ to $R^{21}$ represents a hydroxyl group.

In addition, the present invention is an invention of a processing method for the surface of a semiconductor substrate, having a copper wiring film or a copper alloy wiring film, and a cobalt-containing film, which comprises using the cleaning agent containing (A) the organic acid represented by the general formula (1), (B) the amines selected from the group consisting of (B-1) the diamines represented by the general formula (2), (B-2) the amidines represented by the general formula (3), (B-3) the azoles represented by the general formula (4), and (B-4) the pyrazines or the pyrimidines represented by the general formula (5), (C) the hydroxylamine derivative, and (D) the oxygen scavenger represented by the general formula (6); and being the aqueous solution having a pH of 10 or higher.

Advantageous Effects of Invention

The cleaning agent for the semiconductor substrate of the present invention exerts the following effects (1) to (3).

(1) It is superior in removability of fine polishing particles (particles), such as silica, alumina and the like, and metal impurities (metal residues), remaining at the surface of a semiconductor substrate (a wafer) after a CMP process; and a coating film (a protecting film) containing an anticorrosive such as BTA or the like, formed at the surface of a copper wiring film or the surface of a copper alloy wiring film in the CMP process.

(2) It little generates bimetallic corrosion (galvanic corrosion) of copper (I) oxide formed at the surface of the copper wiring film or the surface of the copper alloy wiring film, and cobalt (II) oxide formed at the surface of a barrier metal mainly composed of, for example, cobalt in the CMP process.

(3) It little removes a metal oxide composed of copper (I) oxide exposed at the surface of the substrate (the wafer) after removing the coating film (the protecting film) containing the anticorrosive. That is, it removes the coating film (the protecting film) containing the anticorrosive, and little removes the coating film of the metal oxide composed of copper (I) oxide (the copper (I) oxide film).

By using the cleaning agent for the semiconductor substrate of the present invention exerting the above-described effects, effects are exerted that a semiconductor substrate having high time course stability of the copper wiring film or the copper alloy wiring film can be obtained, and thus such a semiconductor substrate can be obtained that little generates short circuit between the copper wiring or the copper alloy wiring, because corrosion caused by bimetallic corrosion (galvanic corrosion) can be suppressed and the surface of the copper wiring film or the surface of the copper alloy wiring film can be protected by a metal oxide composed of copper (I) oxide having sufficient film thickness.

In addition, the processing method for the surface of the semiconductor substrate of the present invention is an effective method for cleaning the semiconductor substrate after the CMP process, having the copper wiring film or the copper alloy wiring film, and the cobalt-containing film; and by using the cleaning agent for the semiconductor substrate of the present invention, effects are exerted that fine polishing particles (particles), metal impurities (metal residues) and the coating film (the protecting film) containing an anticorrosive can be removed; and a semiconductor substrate having high time course stability of the copper wiring film or the copper alloy wiring film can be obtained, and thus such a semiconductor substrate can be obtained that little generates short circuit between the copper wiring or the copper alloy wiring, because corrosion caused by bimetallic corrosion (galvanic corrosion) can be suppressed and the semiconductor substrate having the copper wiring film or the copper alloy wiring film protected by a metal oxide composed of copper (I) oxide having sufficient film thickness, can be obtained.

The present inventors have investigated intensively to attain the above-described objects, and have discovered that corrosion of a metallic cobalt, which is a metal composing a barrier metal, is not caused by bimetallic corrosion (galvanic corrosion) of metallic copper (0) and metallic cobalt (0), but caused by bimetallic corrosion (galvanic corrosion) of copper (I) oxide and cobalt (II) oxide generated by oxidation of metallic copper (0) and metallic cobalt (0) by the CMP process. Based on the findings, it was investigated to contain an oxygen scavenger as a component of the cleaning agent, under an idea that corrosion of cobalt (II) oxide and metallic cobalt (0) may be suppressed by matching redox potential (corrosion potential) of copper (I) oxide and cobalt (II) oxide. However, not only fine polishing particles (particles), metal impurities (metal residues) and the coating film (the protecting film) containing an anticorrosive cannot be removed sufficiently, but also redox potential (corrosion potential) of copper (I) oxide and cobalt (II) oxide varies, depending on kind of an organic acid, kind of an amine, and kind of the above-described oxygen scavenger, to be contained aiming at removing fine polishing particles (particles), metal impurities (metal residues) and the coating film (the protecting film) containing an anticorrosive. That is, it has been discovered that by simply containing a conventionally known organic acid, amine, and oxygen scavenger and the like, as components of the cleaning agent, all of the effects of the above-described (1) to (3) cannot be exerted, and the cleaning agent, which is capable of exerting all of the effects of the above-described (1) to (3), can be obtained firstly by combining a specific organic acid, a specific amine and a specific oxygen scavenger, and have thus completed the present invention.

BRIEF DESCRIPTION OF DRAWINGS

FIG. 1 is a photograph (magnification: 250,000 times) of a field-emission-type scanning electron microscope of a wafer after immersing of a patterned wafer using an aqueous solution (a cleaning agent) of Example 6.

FIG. 2 is a photograph (magnification: 200,000 times) of a field-emission-type scanning electron microscope of a wafer after immersing of a patterned wafer using an aqueous solution (a cleaning agent) of Comparative Example 4.

FIG. 3 is a photograph (magnification: 250,000 times) of a field-emission-type scanning electron microscope of a wafer after immersing of a patterned wafer using an aqueous solution (a cleaning agent) of Comparative Example 9.

DESCRIPTION OF EMBODIMENTS

—A Cleaning Agent for a Semiconductor Substrate of the Present Invention—

A cleaning agent for a semiconductor substrate of the present invention is a cleaning agent for a semiconductor substrate having a copper wiring film or a copper alloy wiring film, and a cobalt-containing film to be used in a post-process of the chemical mechanical polishing process, comprising (A) an organic acid represented by general formula (1), (B) amines selected from the group consisting of (B-1) diamines represented by general formula (2), (B-2) amidines represented by general formula (3), (B-3) azoles represented by general formula (4), and (B-4) pyrazines or pyrimidines represented by general formula (5), (C) a hydroxylamine derivative, and (D) an oxygen scavenger represented by general formula (6); and being an aqueous solution having a pH of 10 or higher

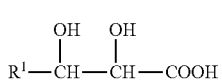

(1)

wherein $R^1$ represents a carboxyl group, a 1,2,3-trihydroxypropyl group or a 3-oxo-1,2-dihydroxypropyl group;

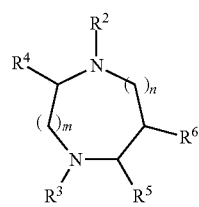

(2)

wherein $R^2$ and $R^3$ each independently represent a hydrogen atom, an alkyl group having 1 to 4 carbon atoms or an aryl group having 6 to 10 carbon atoms, $R^4$ represents a hydrogen atom, a hydroxyl group or an alkyl group having 1 to 4 carbon atoms which may have a hydroxyl group, $R^5$ and $R^6$ each independently represent a hydrogen atom or an alkyl group having 1 to 4 carbon atoms, $R^2$ and $R^3$, $R^3$ and $R^6$, or $R^4$ and $R^6$ may form an alkylene chain having 1 to 3 carbon atoms, m represents 0 or 1, and n represents an integer of 0 to 2;

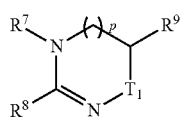

(3)

wherein $R^7$ represents an alkyl group having 1 to 4 carbon atoms, $R^8$ represents an amino group, $R^7$ and $R^8$ may form an alkylene chain having 3 to 6 carbon atoms, $R^9$ represents a hydrogen atom or an alkyl group having 1 to 4 carbon atoms, $T_1$ represents a —$CH_2$— group or a —C(=O)— group, and p represents 0 or 1;

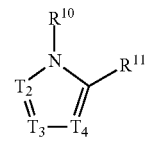

(4)

wherein $R^{10}$ represents a hydrogen atom or an alkyl group having 1 to 4 carbon atoms, $R^{11}$ represents a hydrogen atom, a mercapto group, an amino group, an alkyl group having 1 to 4 carbon atoms or a 2-imidazolyl group, $T_2$ represents a nitrogen atom or a —C(—$R^{12}$)— group, wherein $R^{12}$ represents a hydrogen atom or an alkyl group having 1 to 4 carbon atoms, $T_3$ represents a nitrogen atom or a —C(—$R^{13}$)— group, wherein $R^{13}$ represents a hydrogen atom, a hydroxyl group or an alkyl group having 1 to 4 carbon atoms which may have an amino group, $T_4$ represents a nitrogen atom or a —CH— group, provided that at least one of $T_2$ and $T_4$ represents a nitrogen atom;

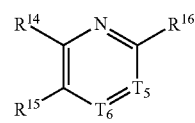

(5)

wherein $R^{14}$ to $R^{16}$ each independently represent a hydrogen atom, a hydroxyl group or an alkyl group having 1 to 4 carbon atoms which may have an amino group or a hydroxyl group, $T_5$ represents a nitrogen atom or a —C(—$R^7$)— group, wherein $R^{17}$ represents a hydrogen atom, a hydroxyl group or an alkyl group having 1 to 4 carbon atoms which may have an amino group or a hydroxyl group, $T_6$ represents a nitrogen atom or a —C(—$R^{18}$)— group, wherein $R^{18}$ represents a hydrogen atom, a hydroxyl group or an alkyl group having 1 to 4 carbon atoms which may have an amino group or a hydroxyl group, provided that at least one of $T_5$ and $T_6$ represents a nitrogen atom;

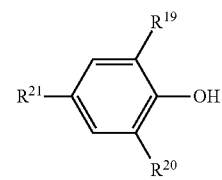

(6)

wherein $R^{19}$ represents a hydrogen atom or a hydroxyl group, $R^{20}$ represents a hydrogen atom or a hydroxyl group, $R^{21}$ represents a hydrogen atom, a hydroxyl group, a carboxyl group or a propoxycarbonyl group, provided that at least one of $R^{19}$ to $R^{21}$ represents a hydroxyl group.

As $R^1$ in general formula (1), a carboxyl group is preferable.

The alkyl group having 1 to 4 carbon atoms represented by $R^2$, $R^3$, $R^5$ and $R^6$ in general formula (2), may be any of a straight chained, branched or cyclic group, and specifically includes, for example, a methyl group, an ethyl group, a n-propyl group, an isopropyl group, a n-butyl group, an isobutyl group, a sec-butyl group, a tert-butyl group, a cyclobutyl group or the like; and among them, a methyl group, which is an alkyl group having one carbon atom, is preferable.

The aryl group having 6 to 10 carbon atoms represented by $R^2$ and $R^3$ in general formula (2), may be any of a monocyclic or a condensed polycyclic group, and specifically includes, for example, a phenyl group, a naphthyl group or the like; and among them, a phenyl group, which is an aryl group having 6 carbon atoms, is preferable.

The alkyl group having 1 to 4 carbon atoms which may have a hydroxyl group, represented by $R^4$ in general formula (2), may be any of a straight chained, branched or cyclic group, and may have one or a plurality of hydroxyl groups. A specific example of the alkyl group includes, for example, an alkyl group having 1 to 4 carbon atoms which does not have a hydroxyl group, for example, a methyl group, an ethyl group, a n-propyl group, an isopropyl group, a n-butyl group, an isobutyl group, a sec-butyl group, a tert-butyl group, a cyclobutyl group or the like; and an alkyl group having 1 to 4 carbon atoms which has a hydroxyl group, for example, a hydroxymethyl group, a 1-hydroxyethyl group, a 2-hydroxyethyl group, a 1,2-dihydroxyethyl group, a 1-hydroxy-n-propyl group, a 2-hydroxy-n-propyl group, a 3-hydroxy-n-propyl group, a 1,2-dihydroxy-n-propyl group, a 1,3-dihydroxy-n-propyl group, a 2,3-dihydroxy-n-propyl group, a 1,2,3-trihydroxy-n-propyl group, a 1-hydroxyisopropyl group, a 2-hydroxyisopropyl group, a 1-hydroxymethyl-1-hydroxyethyl group, a 1-hydroxymethyl-2-hydroxyethyl group, a 1-hydroxymethyl-1,2-dihydroxyethyl group, a 1-hydroxy-n-butyl group, a 2-hydroxy-n-butyl group, a 3-hydroxy-n-butyl group, a 4-hydroxy-n-butyl group or the like.

"The alkylene chain having 1 to 3 carbon atoms" in the case where "$R^2$ and $R^3$, $R^3$ and $R^6$, or $R^4$ and $R^6$ form an alkylene chain having 1 to 3 carbon atoms" in general formula (2), may be any of a straight chained or branched group, and specifically includes, for example, a methylene group, an ethylene group (a dimethylene group), a trimethylene group (a propane-1,3-diyl group), a propylene group (a propane-1,2-diyl group) or the like; and among them, an ethylene group (a dimethylene group), which is an alkylene chain having 2 carbon atoms, is preferable.

As m in general formula (2), 1 is preferable.

As n in general formula (2), 0 or 1 is preferable; and among them, 0 is more preferable.

As $R^2$ and $R^3$ in general formula (2), a hydrogen atom, an alkyl group having 1 to 4 carbon atoms and the one where $R^2$ and $R^3$ form an alkylene chain having 1 to 3 carbon atoms are preferable; and among them, a hydrogen atom and the one where $R^2$ and $R^3$ form an alkylene chain having 1 to 3 carbon atoms are more preferable; and among them, a hydrogen atom is still more preferable.

As $R^4$ to $R^6$ in general formula (2), a hydrogen atom is preferable.

The alkyl group having 1 to 4 carbon atoms represented by $R^7$ and $R^9$ in general formula (3), may be any of a straight chained, branched or cyclic group, and specifically includes, for example, a methyl group, an ethyl group, a n-propyl group, an isopropyl group, a n-butyl group, an isobutyl group, a sec-butyl group, a tert-butyl group, a cyclobutyl group or the like; and among them, a methyl group, which is an alkyl group having one carbon atom, is preferable.

"The alkylene chain having 3 to 6 carbon atoms" in the case where "$R^7$ and $R^8$ form an alkylene chain having 3 to 6 carbon atoms" in general formula (3), may be any of a straight chained or branched group, and specifically includes, for example, a trimethylene group (a propane-1,3-diyl group), a propylene group (a propane-1,2-diyl group), a tetramethylene group (a butane-1,4-diyl group), a 1-methyltrimethylene group (a 1-methylpropane-1,3-diyl group), a 2-methytrimethylene group (a 2-methylpropane-1,3-diyl group), a 1,2-dimethylethylene group (a 1,2-dimethyldimethylene group), a pentamethylene group (a pentane-1,5-diyl group), a 2,2-dimethytrimethylene group (a 2,2-dimethylpropane-1,3-diyl group), a hexamethylene group (a hexane-1,6-diyl group) or the like; and among them, a straight chained alkylene chain having 3 to 6 carbon atoms, selected from a trimethylene group (a propane-1,3-diyl group), a tetramethylene group (a butane-1,4-diyl group), a pentamethylene group (a pentane-1,5-diyl group) and a hexamethylene group (a hexane-1,6-diyl group) are preferable; and among them, a straight chained alkylene chain having 3 to 5 carbon atoms, selected from a trimethylene group (a propane-1,3-diyl group), a tetramethylene group (a butane-1,4-diyl group) and a pentamethylene group (a pentane-1,5-diyl group) are more preferable.

As p in general formula (3), 1 is preferable.

The alkyl group having 1 to 4 carbon atoms represented by $R^{10}$ to $R^{12}$ in general formula (4), may be any of a straight chained, branched or cyclic group, and specifically includes, for example, a methyl group, an ethyl group, a n-propyl group, an isopropyl group, a n-butyl group, an isobutyl group, a sec-butyl group, a tert-butyl group, a cyclobutyl group or the like; and among them, a methyl group, which is an alkyl group having one carbon atom, is preferable.

The alkyl group having 1 to 4 carbon atoms which may have an amino group, represented by $R^{13}$ in general formula (4), may be any of a straight chained, branched or cyclic group, and may have one or a plurality of amino groups. A specific example of the alkyl group includes, for example, an alkyl group having 1 to 4 carbon atoms which does not have an amino group, for example, a methyl group, an ethyl group, a n-propyl group, an isopropyl group, a n-butyl group, an isobutyl group, a sec-butyl group, a tert-butyl group, a cyclobutyl group or the like; and an alkyl group having 1 to 4 carbon atoms which has an amino group, for example, an aminomethyl group, a 1-aminoethyl group, a 2-aminoethyl group, a 1,2-diaminoethyl group, a 1-amino-n-propyl group, a 2-amino-n-propyl group, a 3-amino-n-propyl group, a 1,2-diamino-n-propyl group, a 1,3-diamino-n-propyl group, a 2,3-diamino-n-propyl group, a 1,2,3-triamino-n-propylgroup, a 1-aminoisopropyl group, a 2-aminoisopropyl group, a 1-aminomethyl-1-aminoethyl group, a 1-aminomethyl-2-aminoethyl group, a 1-aminomethyl-1,2-diaminoethyl group, a 1-amino-n-butyl group, a 2-amino-n-butyl group, a 3-amino-n-butyl group, a 4-amino-n-butyl group or the like; and among them, a straight chained an alkyl group having 1 to 4 carbon atoms which has an amino group, for example, an aminomethyl group, a 1-aminoethyl group, a 2-aminoethyl group, a 1,2-diaminoethyl group, a 1-amino-n-propyl group, a 2-amino-n-propyl group, a 3-amino-n-propyl group, a 1,2-diamino-n-propyl group, a 1,3-diamino-n-propyl group, a 2,3-diamino-n-propyl group, a 1,2,3-triamino-n-propyl group, a 1-aminoisopropyl group, a 2-aminoisopropyl group, a 1-aminomethyl-1-aminoethyl group, a 1-aminomethyl-2-aminoethyl group, a 1-aminomethyl-1,2-diaminoethyl group, a 1-amino-n-butyl group, a 2-amino-n-butyl group, a 3-amino-n-butyl group, a 4-amino-n-butyl group or the like, are preferable; and among them, a straight chained an alkyl group having 1 to 4 carbon atoms which has one amino group, selected from, for example, an aminomethyl group, a 1-aminoethyl group, a 2-aminoethyl group, a 1-amino-n-propyl group, a 2-amino-n-propyl group, a 3-amino-n-propyl group, a 1-amino-n-butyl group, a 2-amino-n-butyl group, a 3-amino-n-butyl group and a 4-amino-n-butyl group, are more preferable.

As $R^{10}$ in general formula (4), a hydrogen atom is preferable.

As $R^{11}$ in general formula (4), a hydrogen atom, a mercapto group, an amino group and a 2-imidazolyl group are preferable.

As $R^{12}$ in general formula (4), a hydrogen atom is preferable.

As $R^{13}$ in general formula (4), a hydrogen atom and an alkyl group having 1 to 4 carbon atoms which may have an amino group, are preferable.

The alkyl group having 1 to 4 carbon atom which may have a hydroxyl group, represented by $R^4$ to $R^{16}$ in general formula (5), may be ay of a straight chained, branched or cyclic group, and may have one or a plurality of hydroxyl groups. A specific example of the alkyl group includes, for example, an alkyl group having 1 to 4 carbon atoms which does not have a hydroxyl group, for example, a methyl group, an ethyl group, a n-propyl group, an isopropyl group, a n-butyl group, an isobutyl group, a sec-butyl group, a tert-butyl group, a cyclobutyl group or the like; and an alkyl group having 1 to 4 carbon atoms which has a hydroxyl group, for example, a hydroxymethyl group, a 1-hydroxyethyl group, a 2-hydroxyethyl group, a 1,2-dihydroxyethyl group, a 1-hydroxy-n-propyl group, a 2-hydroxy-n-propyl group, a 3-hydroxy-n-propyl group, a 1,2-dihydroxy-n-propyl group, a 1,3-dihydroxy-n-propyl group, a 2,3-dihydroxy-n-propyl group, a 1,2,3-trihydroxy-n-propyl group, a 1-hydroxyisopropyl group, a 2-hydroxyisopropyl group, a 1-hydroxymethyl-1-hydroxyethyl group, a 1-hydroxymethyl-2-hydroxyethyl group, a 1-hydroxymethyl-1,2-dihydroxyethyl group, a 1-hydroxy-n-butyl group, a 2-hydroxy-n-butyl group, a 3-hydroxy-n-butyl group, a 4-hydroxy-n-butyl group or the like; and among them, an alkyl group having 1 to 4 carbon atoms which does not have a hydroxyl group, for example, a methyl group, an ethyl group, a n-propyl group, an isopropyl group, a n-butyl group, an isobutyl group, a sec-butyl group, a tert-butyl group, a cyclobutyl group or the like, are preferable; and among them, a methyl group, which is an alkyl group having one carbon atom, is more preferable.

As $R^{14}$ to $R^{18}$ in general formula (5), a hydrogen atom and an alkyl group having 1 to 4 carbon atoms which may have a hydroxyl group, are preferable; and among them, a hydrogen atom is more preferable.

As $T_5$ and $T_6$ in general formula (5), the case where only either of the two is a nitrogen atom is preferable.

As $R^{19}$ and $R^{20}$ in general formula (6), a hydroxyl group is preferable.

As $R^{21}$ in general formula (6), a hydrogen atom is preferable.

In the case where $R^{21}$ in general formula (6) is a hydrogen atom, a chemical formula in which $R^{19}$ is a hydrogen atom and $R^{20}$ is a hydroxyl group, and a chemical formula in which $R^{19}$ is a hydroxyl group and $R^{20}$ is a hydrogen atom, represent the same chemical formula (chemical formula of pyrocatechol).

A specific example of (A) the organic acid represented by general formula (1) includes, for example, tartaric acid such as D-tartaric acid, L-tartaric acid, meso-tartaric acid and the like; 2,3,4,5,6-pentahydroxyhexanoic acid such as gluconic acid and the like; 6-oxo-2,3,4,5-tetrahydroxyhexanoic acid such as galacturonic acid and the like; and among them, tartaric acid is preferable. Tartaric acid is a preferable organic acid from the viewpoint that it is easily available, and removability of fine polishing particles (particles), metal impurities (metal residues) and a coating film (a protecting film) containing an anticorrosive is still higher.

As (A) the organic acid represented by general formula (1), one kind of the organic acid may be used alone, or two or more kinds of the organic acids may be used in combination. In addition, these organic acids may be a derivative of the organic acid such as organic acid salt, organic acid ester and the like, as long as they are present as the organic acid represented by general formula (A) or organic ions (anions), in an aqueous solution. It should be noted that as these organic acids, commercially available ones may be used, or those synthesized as appropriate by a method per se may be used.

A specific example of (B-1) the diamines represented by general formula (2) includes, for example, diamines having at least one cyclic structure, for example, piperazine, 1-methylpiperazine, 1-ethylpiperazine, 1-propylpiperazine, 1-butylpiperazine, 2-methylpiperazine, 1,4-dimethylpiperazine, 2,5-dimethylpiperazine, 2,6-dimethylpiperazine, 1-phenylpiperazine, 2-hydroxypiperazine, 2-hydroxymethylpiperazine, hexahydro-1H-1,4-diazepine, 1-methylhexahydro-1H-1,4-diazepine, 2-methylhexahydro-1H-1,4-diazepine, 6-methylhexahydro-1H-1,4-diazepine, octahydro-2-methyl-1,4-diazocine, 1,4-diazabicyclo[2.2.2]octane, 2,7-diazabicyclo[3.2.1]octane, 1,3-diazabicydo[3.2.2]nonane and the like.

Among (B-1) the diamines represented by the above-described general formula (2), diamines represented by the following general formula (2-1) is preferable:

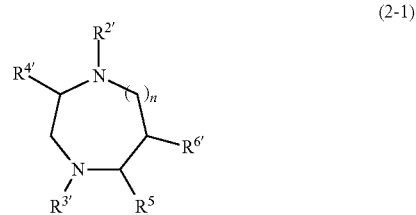

(2-1)

wherein $R^{2'}$ and $R^{3'}$ each independently represent a hydrogen atom or an alkyl group having 1 to 4 carbon atoms, $R^{4'}$ represents a hydrogen atom, a hydroxyl group or an alkyl group having 1 to 4 carbon atoms which may have a hydroxyl group, $R^{6'}$ represents a hydrogen atom or an alkyl group having 1 to 4 carbon atoms, $R^{2'}$ and $R^{3'}$ may form an alkylene chain having 1 to 3 carbon atoms, and $R^5$ and n are the same as described above.

The alkyl group having 1 to 4 carbon atoms represented by $R^{2'}$, $R^{3'}$ and $R^{6'}$ in general formula (2-1), includes a similar one to a specific example of the alkyl group having 1 to 4 carbon atoms represented by $R^2$, $R^3$ and $R^6$ in general formula (2); and a specific example of a preferable alkyl group also includes the similar one.

The alkyl group having 1 to 4 carbon atoms which may have a hydroxyl group, represented by $R^{4'}$ in general formula (2-1), includes a similar one to a specific example of the alkyl group having 1 to 4 carbon atoms which may have a hydroxyl group, represented by $R^4$ in general formula (2).

"The alkylene chain having 1 to 3 carbon atoms" in the case where "$R^{2'}$ and $R^{3'}$ form an alkylene chain having 1 to 3 carbon atoms" in general formula (2-1), includes a similar one to a specific example of "the alkylene chain having 1 to 3 carbon atoms" in general formula (2); and a specific example of a preferable alkylene chain also includes the similar one.

As $R^{4'}$ and $R^{6'}$ in general formula (2-1), a hydrogen atom is preferable.

A specific example of the diamines represented by the above-described general formula (2-1) includes, for example, piperazine, 1-methylpiperazine, 1-ethylpiperazine, 1-propylpiperazine, 1-butylpiperazine, 2-methylpiperazine, 1,4-dimethylpiperazine, 2,5-dimethylpiperazine, 2,6-dimethylpiperazine, 2-hydroxypiperazine, 2-hydroxymethylpiperazine, hexahydro-1H-1,4-diazepine, 1-methylhexahydro-1H-1,4-diazepine, 2-methylhexahydro-1H-1,4-diazepine, 6-methylhexahydro-1H-1,4-diazepine, octahydro-2-methyl-1,4-diazocine, 1,4-diazabicyclo[2.2.2]octane and the like; and among them, includes, for example, piperazine, hexahydro-1H-1,4-diazepine, 1,4-diazabicyclo[2.2.2]octane, as the preferable diamines. These diamines are the preferable amines from the viewpoint that they are easily available, and have still higher removability of a coating film (a protective film) containing an anticorrosive such as benzotriazole, formed at the surface of a copper wiring film or at the surface of a copper-alloy wiring film, in a CMP process.

A specific example of (B-2) the amidines represented by general formula (3) includes, for example, amidines having at least one cyclic structure, for example, diazabicycloundecene (1,8-diazabicyclo[5.4.0]undec-7-ene: DBU), diazabicyclononene (1,5-diazabicyclo[4.3.0]non-5-ene: DBN), 3,4,6,7,8,9,10,11-octahydro-2H-pyrimido[1.2-a]azocine, 3,4,6,7,8,9-hexahydro-2H-pyrido[1.2-a]pyrimidine, 2,5,6,7-terahydro-3H-pyrrolo[1.2-a]imidazole, 3-ethyl-2,3,4,6,7,8,9,10-octahydropyrimido[1.2-a]azepine, creatinine and the like.

Among (B-2) the amidines represented by the above-described general formula (3), amidines represented by the following general formula (3-1) and the following general formula (3-2) (creatinine) are preferable:

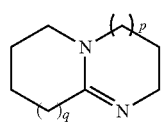

(3-1)

wherein q represents an integer of 0 to 3, and p is the same as described above;

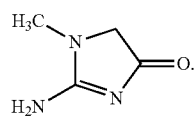

(3-2)

As q in general formula (3-1), an integer of 0 to 2 is preferable.

A specific example of the amidines represented by the above-described general formula (3-1) includes, for example, diazabicycloundecene (1,8-diazabicyclo[5.4.0]undec-7-ene: DBU), diazabicyclononene (1,5-diazabicyclo[4.3.0]non-5-ene: DBN), 3,4,6,7,8,9,10,11-octahydro-2H-pyrimido[1.2-a]azocine, 3,4,6,7,8,9-hexahydro-2H-pyrido[1.2-a]pyrimidine, 2,5,6,7-terahydro-3H-pyrrolo[1.2-a]imidazole, 3-ethyl-2,3,4,6,7,8,9,10-octahydropyrimido[1.2-a]azepine and the like.

Among these amidines, for example, diazabicycloundecene (1,8-diazabicyclo[5.4.0]undec-7-ene: DBU), diazabicyclononene (1,5-diazabicyclo[4.3.0]non-5-ene: DBN) and creatinine, are included as the preferable amidines. These amidines are the preferable amines from the viewpoint that they are easily available, and have still higher removability of a coating film (a protective film) containing an anticorrosive such as benzotriazole, formed at the surface of a copper wiring film or at the surface of a copper-alloy wiring film, in a CMP process.

A specific example of (B-3) the azoles represented by general formula (4) includes, for example, imidazoles such as imidazole, 1-methylimidazole, 2-methylimidazole, 5-methylimidazole, 1,2-dimethylimidazole, 2-mercaptoimidazole, 4,5-dimethyl-2-mercaptoimidazole, 4-hydroxyimidazole, 2,2'-biimidazoe, histamine and the like; pyrazoles such as pyrazole, 1-methylpyrazole, 3-methylpyrazole and the like; 1,2,4-triazoles such as 1,2,4-triazole, 3-methyl-1,2,4-triazole, 3-amino-1,2,4-triazole and the like; and 1,2,3-triazoles such as 1,2,3-triazole, 5-methyl-1,2,3-triazole and the like.

Among (B-3) the azoles represented by the above-described general formula (4), imidazoles represented by the following general formula (4-1), pyrazoles represented by the following general formula (4-2), 1,2,4-triazoles represented by the following general formula (4-3) and 1,2,3-triazoles represented by the following general formula (4-4) are preferable:

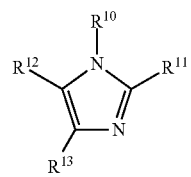

(4-1)

wherein $R^{10}$ to $R^{13}$ are the same as described above;

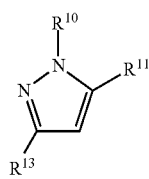

(4-2)

wherein $R^{10}$, $R^{11}$ and $R^{13}$ are the same as described above;

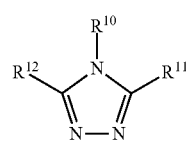

(4-3)

wherein $R^{10}$ to $R^{12}$ are the same as described above;

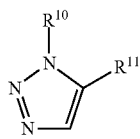
(4-4)

wherein $R^{10}$ and $R^{11}$ are the same as described above.

A specific example of the imidazoles represented by the above-described general formula (4-1) includes, for example, imidazole, 1-methylimidazole, 2-methylimidazole, 5-methylimidazole, 1,2-dimethylimidazole, 2-mercaptoimidazole, 4,5-dimethyl-2-mercaptoimidazole, 4-hydroxyimidazole, 2,2'-biimidazole, histamine and the like.

A specific example of the pyrazoles represented by the above-described general formula (4-2) includes, for example, pyrazole, 1-methylpyrazole, 3-methylpyrazole and the like.

A specific example of the 1,2,4-triazoles represented by the above-described general formula (4-3) includes, for example, 1,2,4-triazole, 3-methyl-1,2,4-triazole, 3-amino-1,2,4-triazole and the like.

A specific example of the 1,2,3-triazoles represented by the above-described general formula (4-4) includes, for example, 1,2,3-triazole, 5-methyl-1,2,3-triazole and the like.

Among these azoles, for example, imidazole, 2-mercaptoimidazole, 2,2'-biimidazole, histamine, pyrazole, 1,2,4-triazole, 3-amino-1,2,4-triazole and 1,2,3-triazole are included as the preferable azoles. These azoles are the preferable amines from the viewpoint that they are easily available, and have still higher removability of a coating film (a protective film) containing an anticorrosive such as benzotriazole, formed at the surface of a copper wiring film or at the surface of a copper-alloy wiring film, in a CMP process.

A specific example of (B-4) the pyrazines or the pyrimidines represented by general formula (5) includes, for example, pyrazines such as pyrazine, 2-methylpyrazine, 2,5-dimethylpyrazine, 2,3,5,6-tetramethylpyrazine, 2-ethyl-3-methylpyrazine, 2-amino-5-methylpyrazine and the like; pyrimidines such as pyrimidine, 2-methylpyrimidine, 4,6-dimethylpyrimidine and the like.

Among (B-4) the pyrazines or the pyrimidines represented by the above-described general formula (5), pyrazines represented by the following general formula (5-1) and pyrimidines represented by the following general formula (5-2) are preferable:

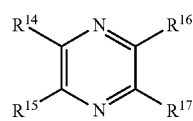
(5-1)

wherein $R^{14}$ to $R^{17}$ are the same as described above;

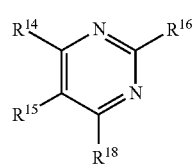
(5-2)

wherein $R^{14}$ to $R^{16}$ and $R^{18}$ are the same as described above.

A specific example of the pyrazines represented by the above-described general formula (5-1) includes, for example, pyrazine, 2-methylpyrazine, 2,5-dimethylpyrazine, 2,3,5,6-tetramethylpyrazine, 2-ethyl-3-methylpyrazine, 2-amino-5-methylpyrazine and the like.

A specific example of the pyrimidines represented by the above-described general formula (5-2) includes, for example, pyrimidine, 2-methylpyrimidine, 4,6-dimethylpyrimidine and the like.

Among these pyrazines and pyrimidines, for example, pyrazine is included as the preferable pyrazines and pyrimidines. Pyrazine is the preferable amine from the viewpoint that it is easily available, and has still higher removability of a coating film (a protective film) containing an anticorrosive such as benzotriazole, formed at the surface of a copper wiring film or at the surface of a copper-alloy wiring film, in a CMP process.

As (B) the amines selected from (B-1) to (B-4), one kind of the amine may be used alone, or two or more kinds of the amines may be used in combination. It should be noted that as these amines, commercially available ones may be used, or those synthesized as appropriate by a method per se may be used.

A specific example of (C) the hydroxylamine derivative includes, for example, a compound represented by the following general formula (7):

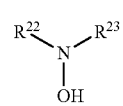
(7)

wherein $R^{22}$ represents an alkyl group having 1 to 6 carbon atoms, and $R^{23}$ represents a hydrogen atom or an alkyl group having 1 to 6 carbon atoms.

The alkyl group having 1 to 6 carbon atoms represented by $R^{22}$ and $R^{23}$ in general formula (7), may be any of a straight chained, branched or cyclic group, and specifically includes, for example, a methyl group, an ethyl group, a n-propyl group, an isopropyl group, a n-butyl group, an isobutyl group, a sec-butyl group, a tert-butyl group, a cyclobutyl group, a n-pentyl group, an isopentyl group, a sec-pentyl group, a tert-pentyl group, a neopentyl group, a 2-methylbutyl group, a 1,2-dimethylpropyl group, a 1-ethylpropyl group, a cyclopentyl group, a n-hexyl group, an isohexyl group, a sec-hexyl group, a tert-hexyl group, a neohexyl group, a 2-methylpentyl group, a 1,2-dimethylbutyl group, a 2,3-dimethylbutyl group, 1-ethylbutyl group, a cyclohexyl group or the like; and among them, a straight chained alkyl group having 2 to 3 carbon atoms, selected from an ethyl group and a n-propyl group, is preferable; and among them, an ethyl group, which is an alkyl group having 2 carbon atoms, is more preferable.

As $R^{23}$ in general formula (7), an alkyl group having 1 to 6 carbon atoms is preferable.

A specific example of (C) the hydroxylamine derivative includes, for example, N-methylhydroxylamine, N,N-dimethylhydroxylamine, N-ethylhydroxylamine, N,N-diethylhydroxylamine, N-n-propylhydroxylamine, N,N-di-n-propylhydroxylamine, N-isopropylhydroxylamine, N,N-diisopropylhydroxylamine, N-n-butylhydroxylamine, N,N-di-n-butylhydroxylamine, N-isobutylhydroxylamine, N,N-diisobutylhydroxylamine, N-sec-butylhydroxylamine, N,N-di-sec-butylhydroxylamine, N-tert-butylhydroxylamine, N,N-di-tert-butylhydroxylamine, N-cyclobutylhydroxylamine, N,N-dicyclobutylhydroxylamine, N-n-pentylhydroxylamine, N,N-di-n-pentylhydroxylamine, N-isopentylhydroxylamine, N,N-diisopentylhydroxylamine, N-sec-pentylhydroxylamine, N,N-di-sec-pentylhydroxylamine, N-tert-pentylhydroxylamine, N,N-di-tert-pentylhydroxylamine, N-neopentylhydroxylamine, N,N-dineopentylhydroxylamine, N-2-methylbutylhydroxylamine, N,N-bis(2-methylbutyl)hydroxylamine, N-1,2-dimethylpropylhydroxylamine, N,N-bis(1,2-dimethylpropyl)hydroxylamine, N-1-ethylpropylhydroxylamine, N,N-bis(1-ethylpropyl)hydroxylamine, N-cycopentylhydroxylamine, N,N-dicydopentylhydroxylamine, N-n-hexylhydroxylamine, N,N-di-n-hexylhydroxylamine, N-isohexylhydroxylamine, N,N-diisohexylhydroxylamine, N-sec-hexylhydroxylamine, N,N-di-sec-hexylhydroxylamine, N-tert-hexylhydroxylamine, N,N-di-tert-hexylhydroxylamine, N-neohexylhydroxylamine, N,N-dineohexylhydroxylamine, N-2-methylpentylhydroxylamine, N,N-bis(2-methylpentyl)hydroxylamine, N-1,2-dimethylbutylhydroxylamine, N,N-bis(1,2-dimethylbutyl)hydroxylamine, N-2,3-dimethylbutylhydroxylamine, N,N-bis(2,3-dimethylbutyl)hydroxylamine, N-1-thylbutylhydroxylamine, N,N-bis(1-ethylbutyl)hydroxylamine, N-cydohexylhydroxylamine, N,N-dicyclohexylhydroxylamine and the like.

Among (C) the hydroxylamine derivative, N-ethylhydroxylamine, N,N-diethylhydroxylamine and N-n-propylhydroxylamine are preferable; and among them, N,N-diethylhydroxylamine and N-n-propylhydroxylamine are more preferable; and N,N-diethylhydroxylamine is still more preferable. N,N-diethylhydroxylamine is a preferable hydroxylamine derivative from the viewpoint that it is easily available, and effect of suppressing corrosion of a copper wiring film or a copper-alloy wiring film, by reduction of divalent copper oxide such as copper (II) oxide and copper (II) hydroxide to copper (I) oxide, and protecting the surface of the copper wiring film or the surface of the copper-alloy wiring film with a metal oxide composed of copper (I) oxide, is still higher; and thus a semiconductor substrate having still higher time course stability of the copper wiring film or the copper alloy wiring film, can be obtained.

As (C) the hydroxylamine derivative, one kind of the hydroxylamine derivative may be used alone, or two or more kinds of the hydroxylamine derivatives may be used in combination. It should be noted that as these hydroxylamine derivatives, commercially available ones may be used, or those synthesized as appropriate by a method per se may be used.

(D) The oxygen scavenger represented by general formula (6) is a compound that has action of removing dissolved oxygen in the cleaning agent and decreasing redox potential of cobalt (II) oxide, and a specific example thereof includes, for example, pyrogallol, pyrocatechol, hydroquinone, 4-hydroxybenzoic acid, propyl 4-hydroxybenzoate, 3,4-dihydroxybenzoic acid, propyl 3,4-dihydroxybenzoate, gallic acid, propyl gallate and the like; and among them, pyrogallol, pyrocatechol, hydroquinone, gallic acid and propyl gallate are preferable; and among them, pyrogallol is more preferable. Pyrogallol is a preferable oxygen scavenger from the viewpoint that it is easily available, and is capable of still more suppressing generation of bimetallic corrosion (galvanic corrosion) of copper (I) oxide and cobalt (II) oxide.

As (D) the oxygen scavenger, one kind of the oxygen scavenger may be used alone, or two or more kinds of the oxygen scavengers may be used in combination. It should be noted that as these oxygen scavengers, commercially available ones may be used, or those synthesized as appropriate by a method per se may be used.

The cleaning agent for the semiconductor substrate of the present invention is a cleaning agent to be used in an aqueous solution, and contains water. The kind of water is not especially limited, as long as adverse influence is not exerted on a substrate (a wafer), in a manufacturing process of a semiconductor substrate. A specific example of water include, for example, purified water such as distilled water, deionized water and the like, for example; ultrapure water and the like; and among them, ultrapure water is preferable. Ultrapure water little contains impurities and is preferable water from the viewpoint that it has little influence adversely on a substrate (a wafer), in a manufacturing process of a semiconductor substrate.

Into the cleaning agent for the semiconductor substrate of the present invention, other components such as (E) an alkali compound, (F) a surfactant and the like may be contained other than (A), (B), (C) and (D) components.

(E) The alkali compound may be contained in the cleaning agent for the semiconductor substrate of the present invention, from the viewpoint that it is capable of mainly adjusting and maintaining pH of the cleaning agent to alkaline. A specific example of (E) the alkali compound includes, for example, a quaternary ammonium salt such as tetramethylammonium hydroxide, tetraethylammonium hydroxide, tetrapropylammonium hydroxide, tetrabutylammonium hydroxide, 2-hydroxyethyltrimethylammonium hydroxide (choline) and the like; an alkali metal hydroxide such as lithium hydroxide, sodium hydroxide, potassium hydroxide, cesium hydroxide and the like; and among them, a quaternary ammonium salt such as tetramethylammonium hydroxide, tetraethylammonium hydroxide, tetrapropylammonium hydroxide, tetrabutylammonium hydroxide, 2-hydroxyethyltrimethylammonium hydroxide (choline) and the like are preferable; and among them, 2-hydroxyethyltrimethylammonium hydroxide (choline) is more preferable.

As (E) the alkali compound, one kind of the alkali compound may be used alone, or two or more kinds of the alkali compounds may be used in combination. It should be noted that as these alkali compounds, commercially available ones may be used, or those synthesized as appropriate by a method per se may be used.

(F) The surfactant may be contained in the cleaning agent for the semiconductor substrate of the present invention, from the viewpoint that it is capable of enhancing removability of fine polishing particles (particles). Such (F) a surfactant includes, for example, an anionic surfactant, a nonionic surfactant, an ampholytic surfactant and the like. A specific example of the anionic surfactant includes, for example, an anionic surfactant having a carboxyl group in the molecule such as a sodium alkylcarboxylate, a potassium alkylcarboxylate, an ammonium alkylcarboxylate, a sodium alkylbenzene carboxylate, a potassium alkylbenzene carboxylate, an ammonium alkylbenzene carboxylate, a sodium polyoxyalkylene alkylether carboxylate, a potassium polyoxyalkylene alkylether carboxylate, an ammonium polyoxyalkylene alkylether carboxylate, a sodium N-acylsarcosinate, a potassium N-acylsarcosinate, an ammonium N-acylsarcosinate, a sodium N-acylglutamate, a potassium N-acylglutamate, an ammonium N-acylglutamate and the like; an anionic surfactant having a sulfonic acid group in the molecule such as a sodium alkylsulfonate, a potassium alkylsulfonate, an ammonium alkylsulfonate, an alkylbenzene sulfonic acid, for example, dodecylbenzenesulfonic acid and the like, a sodium alkylbenzene sulfonate, for example, sodium dodecylbenzenesulfonate and the like, a potassium alkylbenzene sulfonate, for example, potassium dodecylbenzenesulfonate and the like, an ammonium alkylbenzene sulfonate, for example, ammonium dodecylbenzenesulfonate and the like, a sodium alkylnaphthalene sulfonate, a potassium alkylnaphthalene sulfonate, an ammonium alkylnaphthalene sulfonate, a sodium polyoxyalkylene alkylether sulfonate, a potassium polyoxyalkylene alkylether sulfonate, an ammonium polyoxyalkylene alkylether sulfonate, a N-methyl-N-acyltaurine sodium salt, a N-methyl-N-acyltaurine potassium salt, a N-methyl-N-acyltaurine ammonium salt, a sodium dialkyl sulfosuccinate, for example, sodium dioctyl sulfosuccinate and the like, a potassium dialkyl sulfosuccinate, for example, potassium dioctyl sulfosuccinate and the like, an ammonium dialkyl sulfosuccinate, for example, ammonium dioctyl sulfosuccinate and the like; an anionic surfactant having a sulfate group in the molecule such as a sodium alkyl sulfate, for example, sodium lauryl sulfate and the like, a potassium alkyl sulfate, for example, potassium lauryl sulfate and the like, an ammonium alkyl sulfate, for example, ammonium lauryl sulfate and the like; an anionic surfactant having a phosphonate group in the molecule such as a sodium alkylphosphonate, a potassium alkylphosphonate, an ammonium alkylphosphonate, a sodium alkylbenzene phosphonate, a potassium alkylbenzene phosphonate, an ammonium alkylbenzene phosphonate, a sodium polyoxyalkylene alkylether phosphonate, a potassium polyoxyalkylene alkylether phosphonate, an ammonium polyoxyalkylene alkylether phosphonate and the like. A specific example of the nonionic surfactant includes, for example, a polyoxyalkylene alkylether such as polyoxyethylene stearylether and the like, a polyoxyalkylene alkenylether such as polyoxyethylene oleylether and the like, a polyoxyethylene alkylphenylether such as polyoxyethylene nonylphenylether and the like, a polyoxyalkylene glycol such as polyoxypropylene polyoxyethylene glycol and the like, a polyoxyalkylene monoalkytate such as polyoxyethylene monostearate and the like, a bispolyoxyalkylene alkylamide such as bispolyoxyethylene stearylamide and the like. A specific example of the ampholytic surfactant includes, for example, a carboxy betaine such as an alkyl-N,N-dimethylaminoacetic acid betaine, an alkyl-N,N-dihydroxyethylaminoacetic acid betaine and the like; a sulfo betaine such as an alkyl-N,N-dimethylsulfoethylene ammonium betaine and the like; an imidazolinium betaine such as 2-alkyl-N-arboxymethyl-N-hydroxyethylimidazolinium betaine and the like; an alkylamine oxide such as an N,N-dimethylalkylamine oxide and the like.

As (F) the surfactant, one kind of the surfactant may be used alone, or two or more kinds of the surfactants may be used in combination. It should be noted that as these surfactants, commercially available ones may be used, or those synthesized as appropriate by a method per se may be used.

There may be the case where, as the cleaning agent for the semiconductor substrate of the present invention, such a cleaning agent (an aqueous solution) is desirable that does not contain other components other than the above-described (A), (B), (C), (D) and (E) components, and water, in view of enabling cleaning a substrate (a wafer) without influencing adversely on a metal or the like present at the surface of a substrate, such as a copper wiring film or a copper alloy wiring film, a cobalt-containing film or the like. It should be noted that "not containing other components (composing of only the above-described (A), (B), (C), (D) and (E) components, and water)" means not to contain other components in certain amount or more, which influences adversely on the above-described substrate (the wafer). That is, it does not necessarily exclude containing of trace amount of other components (for the other components to be mixed in trace amount), and means to substantially no contain other components.

It is desirable that the cleaning agent for the semiconductor substrate of the present invention has a pH of 10 or higher at 25° C. Among them, it is preferable that the pH is 10 to 13, more preferable that the pH is 10 to 12.5, and still more preferable that the pH is 10.5 to 11.5. When the pH is less than 10, a cobalt-containing film present at the surface of a substrate (a wafer) could be corroded fiercely, while when the pH is more than 13, it is difficult to match redox potential (corrosion potential) between copper (I) oxide and cobalt (II) oxide, and bimetallic corrosion (galvanic corrosion) of copper (I) oxide and cobalt (II) oxide could not be suppressed. It should be noted that pH adjustment may be carried out mainly by adjusting (E) the alkali compound content.

Measurement of pH of the cleaning agent for the semiconductor substrate of the present invention may be carried out using a commercially available pH meter, in accordance with JIS Z8802-1984, without dilution.

It is desirable that (A) the organic acid represented by general formula (1), (B) the amines selected from the group consisting of (B-1) the diamines represented by general formula (2), (B-2) the amidines represented by general formula (3), (B-3) the azoles represented by general formula (4), and (B-4) the pyrazines or the pyrimidines represented by general formula (5), (C) the hydroxylamine derivative, and (D) the oxygen scavenger represented by general formula (6); and (E) the alkali compound and (F) the surfactant, which are supplemental components, in the cleaning agent for the semiconductor substrate of the present invention are adjusted to % by weight concentration shown below.

Concentration of (A) the organic acid represented by general formula (1) is usually 0.001 to 5% by weight, preferably 0.001 to 3% by weight, and more preferably 0.001 to 1% by weight, as % by weight of (A), relative to total weight of the cleaning agent. When concentration of (A) is less than 0.001% by weight, sufficient removability for fine polishing particles (particles), metal impurities (metal residues) and a coating film (a protecting film) containing an anticorrosive could not be obtained. When concentration of (A) is more than 5% by weight, copper (I) oxide at the surface of a copper wiring film or the surface of a copper alloy wiring film could be dissolved.

Concentration of (B) the amines selected from the group consisting of (B-1) the diamines represented by general formula (2), (B-2) the amidines represented by general formula (3), (B-3) the azoles represented by general formula (4), and (B-4) the pyrazines or the pyrimidines represented by general formula (5) is usually 0.0005 to 5% by weight, preferably 0.001 to 3% by weight, and more preferably 0.001 to 1% by weight, as % by weight of (B), relative to total weight of the cleaning agent. When concentration of (B) is less than 0.0005% by weight, sufficient removability for fine polishing particles (particles), metal impurities (metal residues) and a coating film (a protecting film) containing an anticorrosive could not be obtained. When concentration of (B) is more than 5% by weight, a complex is formed with copper derived from a copper wiring film, which remains as an impurity at the surface of a semiconductor substrate (a wafer) and could contaminate the semiconductor substrate (the wafer).

Concentration of (C) the hydroxylamine derivative is usually 0.01 to 25% by weight, preferably 0.01 to 5% by weight, and more preferably 0.01 to 0.5% by weight, as % by weight of (C), relative to total weight of the cleaning agent. When concentration of (C) is less than 0.01% by weight, not only protection effect of the surface of a copper wiring film or the surface of a copper alloy wiring film by a metal oxide composed of copper (I) oxide, could not be obtained sufficiently, but also oxidation (corrosion) to the copper wiring film or the copper alloy wiring film, or a cobalt-containing film, by dissolved oxygen in the aqueous solution, could not be suppressed. When concentration of (C) is more than 25% by weight, (C) could not dissolve completely in the aqueous solution, and could incur phase separation.

Concentration of (D) the oxygen scavenger represented by general formula (6) is usually 0.0001 to 1% by weight, preferably 0.0001 to 0.01% by weight, and more preferably 0.0001 to 0.001% by weight, as % by weight of (D), relative to total weight of the cleaning agent. When concentration of (D) is less than 0.0001% by weight, bimetallic corrosion (galvanic corrosion) of copper (I) oxide and cobalt (II) oxide, could not be suppressed sufficiently, and a cobalt-containing film could be corroded. When concentration of (D) is more than 1% by weight, a complex is formed with copper derived from a copper wiring film, which remains as an impurity at the surface of a semiconductor substrate (a wafer) and could contaminate the semiconductor substrate (the wafer).

Concentration of (E) the alkali compound is usually 0.1 to 5% by weight, preferably 0.5 to 4% by weight, and more preferably 1 to 4% by weight, as % by weight of (E), relative to total weight of the cleaning agent.

Concentration of (F) the surfactant is usually 0.0001 to 1% by weight, preferably 0.001 to 0.5% by weight, and more preferably 0.005 to 0.1% by weight, as % by weight of (F), relative to total weight of the cleaning agent. When concentration of (F) is more than 1% by weight, (F) the surfactant remain as impurities at the surface of a semiconductor substrate (a wafer) and could contaminate the semiconductor substrate (the wafer).

A preparation method for the cleaning agent for the semiconductor substrate of the present invention itself is not especially limited, as long as it is capable of preparing an aqueous solution containing (A) the organic acid represented by general formula (1), (B) the amines selected from the group consisting of (B-1) the diamines represented by general formula (2), (B-2) the amidines represented by general formula (3), (B-3) the azoles represented by general formula (4), and (B-4) the pyrazines or the pyrimidines represented by general formula (5), (C) the hydroxylamine derivative, and (D) the oxygen scavenger represented by general formula (6); and (E) the alkali compound and (F) the surfactant, to be added as necessary. A specific example of the preparation method includes, for example, a method for adding (A) the organic acid represented by general formula (1), (B) the amines selected from the group consisting of (B-1) the diamines represented by general formula (2), (B-2) the amidines represented by general formula (3), (B-3) the azoles represented by general formula (4), and (B-4) the pyrazines or the pyrimidines represented by general formula (5), (C) the hydroxylamine derivative, and (D) the oxygen scavenger represented by general formula (6), and still more, if necessary, (F) the surfactant into ultrapure water after removing dissolved oxygen, and after adjusting to desired pH by adding (E) the alkali compound, stirring or the like, to obtain a uniform aqueous solution.

As a stirring apparatus to be used in preparing the cleaning agent for the semiconductor substrate of the present invention, for example, a stirring machine, a dispersing machine or the like can be used. The stirring machine includes, for example, a mechanical stirrer, a magnetic stirrer or the like. In addition, the dispersing machine includes, for example, a homogenizer, an ultrasonic wave dispersing machine, a beads mill or the like.

The cleaning agent for the semiconductor substrate of the present invention may be subjected to filtration processing or the like before use, without any trouble.

—A Substrate as a Cleaning Object in the Cleaning Agent for the Semiconductor Substrate of the Present Invention—

The semiconductor substrate, which is a cleaning object in the cleaning agent for the semiconductor substrate of the present invention, is a substrate having at least a copper wiring film or a copper alloy wiring film, and a cobalt-containing film at the upper part of a wafer composing the semiconductor substrate, and is a substrate in a contacted state of the copper wiring film or the copper alloy wiring film, and the cobalt-containing film at the surface of the substrate, or the like (hereafter it may be abbreviated as the semiconductor substrate for the present invention).

A specific example of a wafer composing the semiconductor substrate for the present invention includes a wafer composed of a silicon type material, for example, a silicon (Si) wafer, a silicon carbide (SIC) wafer, a resin type wafer containing silicon (a glass epoxy wafer); a gallium phosphide (GaP) wafer, a gallium arsenide (GaAs) wafer, an indium phosphide (InP) wafer or the like. In addition, the silicon (Si) wafer may be an n-type silicon (Si) wafer doped with a pentavalent atom, for example, phosphorus (P), arsenic (As), antimony (Sb) or the like; a p-type silicon (Si) wafer doped with a trivalent atom, for example, boron (B), gallium (Ga) or the like. It should be noted that silicon (Si) in the silicon (Si) wafer may be any of, for example, amorphous silicon, single-crystal silicon, polycrystalline silicon, polysilicon or the like. Among these wafers, the cleaning agent for the semiconductor substrate of the present invention is useful for the wafer composed of the silicon type material, for example, the silicon (Si) wafer, the silicon carbide (SIC) wafer, the resin type wafer containing silicon (the glass-epoxy wafer) or the like.

The semiconductor substrate for the present invention may have an insulating film on the upper part of the above-described wafer. A specific example of the insulation film includes, for example, a silicon oxide film such as a silicon dioxide ($SiO_2$) film, a tetraethyl orthosilicate $Si(OC_2H_5)_4$ film (a TEOS film) or the like; a silicon nitride film of, for example, silicon nitride ($Si_3N_4$), silicon nitride carbide (SiNC) or the like; a low-dielectric (Low-k) film, (a SiOC film, a SiC film or the like); or the like.

The semiconductor substrate for the present invention is a substrate having a wiring film mainly composed of copper, and the wiring film mainly composed of copper referred to in the present invention may be a wiring film composed of only metallic copper (a copper wiring film) or an alloy based wiring film composed of metallic copper and other metals (a copper alloy wiring film). A specific example of the copper alloy wiring film includes, for example, an alloy based wiring film composed of one or more kinds of metals selected from aluminum (Al), titanium (Ti), chromium (Cr), manganese (Mn), tantalum (Ta), tungsten (W) or the like, and copper, and more specifically, for example, a copper-aluminum alloy wiring film (a Cu—Al alloy wiring film), a copper-titanium alloy wiring film (a Cu—Ti alloy wiring film), a copper-chromium alloy wiring film (a Cu—Cr alloy wiring film), a copper-manganese alloy wiring film (a Cu—Mn alloy wiring film), a copper-tantalum alloy wiring film (a Cu—Ta alloy wiring film), a copper-tungsten alloy wiring film (a Cu—W alloy wiring film) or the like. Among these copper wiring films or copper alloy wiring films, the cleaning agent for the semiconductor substrate of the present invention is useful for the substrate having the wiring film composed of only metallic copper (the copper wiring film).

The semiconductor substrate for the present invention is a substrate having a cobalt-containing film, and the cobalt-containing film means a metal film mainly composed of cobalt. The metal film mainly composed of cobalt in the present invention may be a metal film composed of only metallic cobalt (a cobalt metal film) or an alloy based metal film composed of metallic cobalt and other metals (a cobalt alloy metal film). A specific example of the cobalt alloy metal film includes, for example, an alloy based metal film composed of one or more kinds of metals selected from titanium (Ti), chromium (Cr), iron (Fe), nickel (Ni), molybdenum (Mo), palladium (Pd), tantalum (Ta), tungsten (W) or the like, and cobalt; and more specifically includes, for example, a cobalt-titanium alloy metal film (a Co—Ti alloy metal film), a cobalt-chromium alloy metal film (a Co—Cr alloy metal film), a cobalt-iron alloy metal film (a Co—Fe alloy metal film), a cobalt-nickel alloy metal film (a Co—Ni alloy metal film), a cobalt-molybdenum alloy metal film (a Co—Mo alloy metal film), a cobalt-palladium alloy metal film (a Co—Pd alloy metal film), a cobalt-tantalum alloy metal film (a Co—Ta alloy metal film), a cobalt-tungsten alloy metal film (a Co—W alloy metal film) or the like. Among these metal films mainly composed of cobalt, the cleaning agent for the semiconductor substrate of the present invention is useful for the substrate having the metal film composed of only metallic cobalt (the cobalt metal film). In addition, the cobalt-containing film (the metallic film mainly composed of cobalt) is generally used as a barrier metal.

A preferable substrate, among the semiconductor substrates for the present invention, includes a substrate having at least the wiring film composed of only metallic copper (the copper wiring film) and the metal film composed of only metallic cobalt (for example, a cobalt barrier metal), at the upper part of a wafer composing the semiconductor substrate, where the metal film is a barrier metal of the copper wiring film, and the copper wiring film and the cobalt barrier metal is a substrate in a contacted state at the surface of the substrate.

A method for forming the above-described insulation film, the copper wiring film or the copper alloy wiring film, the cobalt-containing film (for example, the cobalt barrier metal) or the like, on a wafer composing the semiconductor substrate for the present invention, is not especially limited, as long as it is a method usually carried out in this field. A specific example of a formation method for the insulation film includes, for example, a formation method of carrying out heat treatment of a wafer composing the semiconductor substrate for the present invention, under presence of oxygen gas, to form a silicon oxide film, and then forming a silicon nitride film by a chemical vapor deposition method (a CVD method) by flowing silane gas and ammonia gas. A specific example of a formation method for the copper wiring film or the copper alloy wiring film, and the cobalt-containing film (for example, the cobalt barrier metal) includes, for example, a formation method for the copper wiring film or the copper alloy wiring film, and the cobalt-containing film (for example, the cobalt barrier metal), by forming a circuit such as a resist, on a wafer having the above-described insulating film, and then adopting plating, the CVD method or the like.

—Usage Pattern of the Cleaning Agent for the Semiconductor Substrate of the Present Invention—

The cleaning agent for the semiconductor substrate of the present invention is a cleaning agent to be used in a post-process of a chemical mechanical polishing (CMP) process. Specifically, the cleaning agent for the semiconductor substrate of the present invention is a cleaning agent to be used in a cleaning post-process of subjecting a semiconductor substrate having the copper wiring film or the copper alloy wiring film, and the cobalt-containing film to the CMP process. By using the cleaning agent for the semiconductor substrate of the present invention in the cleaning process, which is the post-process of the CMP process, (1) fine polishing particles (particles), such as silica, alumina and the like, and metal impurities (metal residues) remaining at the surface of the semiconductor substrate after the CMP process, and a coating film (a protecting film) containing an anticorrosive such as BTA or the like, formed at the surface of the copper wiring film or the surface of the copper alloy wiring film, can be removed sufficiently, (2) corrosion caused by bimetallic corrosion (galvanic corrosion) can be suppressed, and (3) a semiconductor substrate having the copper wiring film or the copper alloy wiring film protected by a metal oxide composed of copper (I) oxide having sufficient film thickness, can be obtained; and thus a semiconductor substrate having high time course stability of the copper wiring film or the copper alloy wiring film can be obtained, therefore such a semiconductor substrate can be obtained that little generates short circuit between the copper wiring or the copper alloy wiring.

—A Processing Method for the Surface of a Semiconductor Substrate of the Present Invention—

A processing method for the surface of a semiconductor substrate of the present invention is a processing method for the surface of a semiconductor substrate having a copper wiring film or a copper alloy wiring film, and a cobalt-containing film, which comprises using the cleaning agent containing (A) the organic acid represented by the general formula (1), (B) the amines selected from the group consisting of (B-1) the diamines represented by the general formula (2), (B-2) the amidines represented by the general formula (3), (B-3) the azoles represented by the general formula (4), and (B-4) the pyrazines or the pyrimidines represented by the general formula (5), (C) the hydroxylamine derivative, and (D) the oxygen scavenger represented by the general formula (6); if necessary, (E) the alkali compound and (F) the surfactant; and being the aqueous solution having a pH of 10 or higher. That is, the processing method for the surface of the semiconductor substrate of the present invention is a method characterized by using the cleaning agent for the semiconductor substrate of the present invention, and the processing method itself is not especially limited.

As a specific example of the processing method for the surface of the semiconductor substrate of the present invention, firstly, the cleaning agent for the semiconductor substrate of the present invention, which has been adjusted to have a predetermined concentration range by the above-described preparation method, is prepared. Next, for example, by immersing a semiconductor substrate having a copper wiring film or a copper alloy wiring film, and a cobalt-containing film into the cleaning agent for the semiconductor substrate of the present invention, the semiconductor substrate can be cleaned. It should be noted that a cleaning method is not especially limited to an immersion method, and a method usually carried out in this field may be adopted as appropriate, such as a spinning (dropping)

method, where the cleaning agent for the semiconductor substrate of the present invention is dropped while rotating the semiconductor substrate, a spraying method, where the cleaning agent for the semiconductor substrate of the present invention is sprayed or the like, other than the immersion method.

As a processing system of the semiconductor substrate in the processing method for the surface of the semiconductor substrate of the present invention, either of a single wafer processing or a batch wafer processing may be adopted. The single wafer processing is a processing which is generally said to be a system for processing the semiconductor substrate piece by piece, and the batch wafer processing is a processing which is generally said to be a system for processing multiple pieces of the semiconductor substrates at the same time.

A processing temperature in the processing method for the surface of the semiconductor substrate of the present invention is not especially limited, as long as it is a processing temperature usually carried out in this field. A specific example of the processing temperature includes, for example, usually 10 to 40° C., and preferably 15 to 30° C.

A processing time in the processing method for the surface of the semiconductor substrate of the present invention cannot be said unconditionally, because it depends on kinds of the (A) to (D) components in the cleaning agent for the semiconductor substrate of the present invention, and concentration thereof, and practically it is usually 10 seconds to 2 minutes, preferably 20 seconds to 1 minute and 30 seconds, and more preferably 30 seconds to 1 minute.

EXAMPLES

Explanation on the present invention is given specifically below, based on Examples and Comparative Examples, and the present invention should not be limited to these Examples. It should be noted that "%" in the following Examples means weight basis (w/w) %, unless otherwise specified.

—A Preparation Method for a Substrate Having a Copper (I) Oxide Film (an Evaluation Substrate A)—

A substrate plated with copper, having a diameter of 8 inch, (a silicon substrate having copper plated film: 1.5 μm/copper seed layer/titanium barrier layer/silicon oxidized film: 300 nm) was cut into small pieces having a size of 2 cm×2 cm, which was immersed in 0.1 N hydrochloric acid for 1 minute to remove an oxidized film at the surface of the substrate. Next, the substrate was processed for 3 hours, using a UV ozone cleaner (UV253, manufactured by Filgen, Inc.), and immersed in a 5% aqueous solution of diethylhydroxylamine (DEHA) for 1 hour, and then rinsed with pure water for 10 seconds, and the substrate was dried to prepare a substrate having a copper (I) oxide film, which was referred to as the evaluation substrate A.

—A Preparation Method for a Substrate Having Benzotriazole and a Complex Between Copper (I) and Benzotriazole (an Evaluation Substrate B)—

The surface of a substrate plated with copper, having a diameter of 4 inch, (a silicon substrate having copper plated film: 1.5 μm/copper seed layer/titanium barrier layer/silicon oxidized film: 300 nm) was planarized by polishing for 1 minute, using model slurry prepared in accordance with JP-A-2011-3665, and then rinsed with pure water for 10 seconds and the substrate was dried. Next, the substrate was cut into small pieces having a size of 2 cm×2 cm to prepare a substrate adhered with benzotriazole and a complex between copper (I) and benzotriazole at the surface of the copper plated, which was referred to as the evaluation substrate B.

—A Preparation Method for a Substrate Having a Cobalt (II) Oxide Film (an Evaluation Substrate C)—

A substrate sputtered with cobalt, having a diameter of 8 inch, was cut into small pieces having a size of 2 cm×2 cm, which was immersed in 0.1 N hydrochloric acid for 1 minute to remove an oxidized film at the surface of the substrate. Next, the substrate was processed for 3 hours, using a UV ozone cleaner (UV253, manufactured by Filgen, Inc.) to prepare a substrate having a cobalt (II) oxide film, which was referred to as the evaluation substrate C.

—A Preparation Method for a Substrate Having a Copper (I) Oxide Film (an Evaluation Substrate D)—

At the surface of a substrate with a silicon oxidized film, having a diameter of 4 inch, resist LOR and TSMR7cp were coated in this order, under condition of 500 rpm/5 seconds, and 3000 rpm/30 seconds, respectively using a spin coater (MS-A200, manufactured by MIKASA Co., Ltd.). Next, the substrate was exposed (exposure amount: 50 mJ/cm$^2$), via a mask, using a double-sided aligner (SUSS MA6/BA6, manufactured by Suss Microtec K.K.), followed by developing processing by immersing it in a 2.4% aqueous solution of tetramethylammonium hydroxide (TMAH), for 100 seconds. The substrate after developing processing was etched for 30 seconds, using a compact-type dry etching apparatus (CSE-1210 model, manufactured by ULVAC, Inc.) to decompose organic substances at the resist surface, and then vapor deposition of a metallic copper film, having a thickness of about 6 nm, was carried out using an electron beam vapor deposition apparatus (EX-550-D10, manufactured by ULVAC, Inc.), and then by immersing it in acetone for 20 minutes, a resist was lift-off. Next, the substrate having the metallic copper film was cut into small pieces having a size of 1 cm×1 cm, which was processed for 1 hour, using a UV ozone cleaner (UV253, manufactured by Filgen, Inc.) to prepare a substrate having a copper (I) oxide film, which was referred to as the evaluation substrate D.

Examples 1 to 23 and Comparative Examples 1 to 30

Evaluations of (a) to (c), Using Various Kinds of Aqueous Solutions (Cleaning Agents)

(a) Evaluation of Solubility of Copper (I) Oxide

Each 40 mL of aqueous solutions (cleaning agents) was prepared, each containing various kinds of organic acids, amines, hydroxylamine or hydroxylamine derivatives and oxygen scavengers, shown in Table 1 or Table 2, in an amount of % by weight, shown in Table 1 or Table 2, and having a predetermined pH value adjusted using choline. Next, the evaluation substrate A was put into these aqueous solutions (these cleaning agents), and immersed at room temperature for 3 minutes under stirring, and then each 8 mL of the aqueous solutions (the cleaning agents) was sampled. After that, into thus sampled aqueous solutions (cleaning agents), 100 μL of concentrated nitric acid was added to make the solutions acidic, and then dissolved amount of copper contained in copper (I) oxide was measured using an inductively coupled plasma atomic emission spectrometry (ICP-AES) (SPS-3100, manufactured by SII Co., Ltd.). Results thereof are shown in Table 1 and Table 2. It should be noted that presently required wiring width of a copper wiring is 10 to 20 nm, and film thickness of copper (1) oxide at the surface of the copper wiring film after a CMP process, in this case, is estimated to be about 5 to 7 nm. In addition, it is considered that copper (I) oxide of the substrate is necessary to have a film thickness of 1 nm or thicker, for a substrate through a cleaning process after the CMP process to maintain a stable surface of the copper (I) oxide. Accordingly, it is considered necessary to suppress dissolution of a copper (I) oxide film at the surface of the substrate (wafer) to at least 4 nm or less, during 1 to 2 minutes of cleaning time of a general practical machine. When the dissolution amount of copper (I) oxide to be suppressed is calculated, in consideration of area (2 cm×2 cm) of the evaluation substrate A used, and volume (40 mL) of the aqueous solutions (the cleaning agents), it is necessary to suppress the dissolution amount to at least 0.4 ppm or less. Based on the above consideration, the aqueous solutions (the cleaning agents) showing 0.4 ppm or less of a dissolution amount of copper (I) oxide were judged "good" in view of time course stability of a copper wiring and corrosion suppression capability, while the aqueous solutions (the cleaning agents) showing more than 0.4 ppm of a dissolution amount of copper (I) oxide were judged "poor" in view of time course stability of a copper wiring and corrosion suppression capability.

(b) Evaluation of Removability of Benzotriazole

Each 10 mL of aqueous solutions (cleaning agents) was prepared, each containing various kinds of organic acids, amines, hydroxylamine or hydroxylamine derivatives and oxygen scavengers, shown in Table 1 or Table 2, in an amount of % by weight, shown in Table 1 or Table 2, and having a predetermined pH value adjusted using choline. Next, the evaluation substrate B was put into these aqueous solutions (these cleaning agents), and immersed at room temperature for 1 minute under stirring. The evaluation substrate B was taken out from the aqueous solutions (the cleaning agents) and rinsed with flowing pure water for 10 seconds, and dried with nitrogen gas. After that, the evaluation substrate B was immersed in 1.5 mL of 0.1 N hydrochloric acid at room temperature for 5 minutes to extract benzotriazole remained in the evaluation substrate B, and then into 1 mL in 1.5 mL of the extracted solution, 100 μL of a 1 N aqueous solution of sodium hydroxide was added to neutralize the solution to quantify amount of benzotriazole contained in the extracted solution, using high-performance liquid chromatography (developing solvent; acetonitrile:water =1:9, flow speed; 1.2 mL/min, UV detect; 254 nm, retention time; 11 min). Results thereof are shown in Table 1 and Table 2. It should be noted that adhered amount of benzotriazole (benzotriazole itself and a complex between copper (I) and benzotriazole) relative to the surface of a copper wiring after a CMP process is about 60 ng/cm$^2$, although it depends on slurry. In cleaning using a general practical machine, cleaning is carried out for 1 to 2 minutes using a brush, however, in the present evaluation experiment, a simplified evaluation was carried out by immersion cleaning for 1 minute. By carrying out evaluation of removability of benzotriazole by a general practical machine, using the aqueous solutions (the cleaning agents), which provided evaluation result of a removal rate of 75% or higher of benzotriazole (benzotriazole itself and a complex between copper (I) and benzotriazole) (residual amount of benzotriazole is 15 ng/cm$^2$ or less) in the simplified evaluation, complete removal of benzotriazole (benzotriazole itself and a complex between copper (I) and benzotriazole) from the substrate (wafer) was confirmed. Based on the above result, in the present simplified evaluation, the aqueous solutions (the cleaning agents) showing 75% or higher of a removal rate of benzotriazole (residual amount of benzotriazole is 15 ng/cm$^2$ or less) were judged "good" in view of removability of benzotriazole, while the aqueous solutions (the cleaning agents) showing less than 75% of a removal rate of benzotriazole (residual amount of benzotriazole is more than 15 ng/cm$^2$) were judged "poor" in view of removability of benzotriazole.

(c) Evaluation of Redox Potential (Corrosion Potential)

Each 1 mL of aqueous solutions (cleaning agents) was prepared, each containing various kinds of organic acids, amines, hydroxylamine or hydroxylamine derivatives and oxygen scavengers, shown in Table 1 or Table 2, in an amount of % by weight, shown in Table 1 or Table 2, and having a predetermined pH value adjusted using choline. Next, redox potential (corrosion potential) of each of the evaluation substrate A and the evaluation substrate C was measured to determine potential difference thereof, using three-pole cells of a potentiostat, where the evaluation substrate A or the evaluation substrate C was used as a working electrode, a platinum wire as a counter electrode, and a saturated silver/silver chloride electrode as a reference electrode, and by immersing these three-pole cells into the above-described aqueous solutions (the cleaning agents). Results thereof are shown in Table 1 and Table 2. In addition, into the aqueous solution (the cleaning agent) of Example 6, a CMP processed patterned wafer (produced by Philtech Inc.) of copper (I) oxide and cobalt (II) oxide was put and immersed at room temperature for 3 minutes under stirring. Next, the patterned wafer was taken out from the aqueous solution (the cleaning agent) and rinsed with flowing pure water for 10 seconds, and dried with nitrogen gas. Corrosion degree of the patterned wafer after drying was observed using a field emission scanning electron microscope (FE-SEM) (S-4800, manufactured by Hitachi High-Technologies Corp.). Result thereof is shown in FIG. 1. At the same time, observation drawings of corrosion degree in the case of immersing the patterned wafer, using the aqueous solutions (the cleaning agents) of Comparative Example 4 and Comparative Example 9, are shown in FIG. 2 and FIG. 3, respectively. It should be noted that in FIGS. 1 to 3, a white portion at the center of the photograph represents copper, a black stripe portion along the white portion representing copper represents cobalt, and a white stripe portion along the black portion representing cobalt represents titanium present in the lower layer of cobalt. As is understood from FIGS. 1 to 3, in the case where the patterned wafer was immersed using the aqueous solution (the cleaning agent) of Example 6, cobalt was not corroded. On the other hand, in the case where the patterned wafer was immersed using the aqueous solutions (the cleaning agents) of Comparative Example 4 and Comparative Example 9, cobalt was corroded caused by bimetallic corrosion (galvanic corrosion) of copper (I) oxide and cobalt (II) oxide, and thus the titanium layer present in the lower layer was exposed. Potential differences of the aqueous solution (the cleaning agent) of Example 6, exhibited no corrosion, and the aqueous solutions (the cleaning agents) of Comparative Example 4 and Comparative Example 9, exhibited corrosion, were 0.05 V, 0.08 V and 0.19 V, respectively. Based on the above results, the aqueous solutions (the cleaning agents) having 0.05 V or lower of a potential difference of redox potential (corrosion potential) of copper (I) oxide and cobalt (II) oxide were judged "good" in view of suppression capability of bimetallic corrosion (galvanic corrosion), while the aqueous solutions (the cleaning agents) having more than 0.05 V of a potential difference of redox potential (corrosion potential) of copper (I) oxide and cobalt (II) oxide were judged "poor" in view of suppression capability of bimetallic corrosion (galvanic corrosion).

TABLE 1

| | Organic acid | weight % | Amine | weight % | HA or HA derivative | weight % | Oxygen scavenger | weight % | pH | Evaluation method (a) Solubility of Cu$_2$O (ppm) | Evaluation method (b) Residual amount of BTA (ng/cm$^2$) | Evaluation method (c) Potential difference (V) |
|---|---|---|---|---|---|---|---|---|---|---|---|---|
| Example 1 | tartaric acid | 0.038 | piperazine | 0.021 | DEHA | 0.09 | pyrogallol | 0.0005 | 11 | 0.15 | 12 | 0.02 |
| Example 2 | tartaric acid | 0.038 | piperazine | 0.002 | DEHA | 0.09 | pyrogallol | 0.0005 | 11 | 0.14 | 14 | 0.04 |
| Example 3 | tartaric acid | 0.038 | N-methyl-piperazine | 0.021 | DEHA | 0.09 | pyrogallol | 0.0005 | 11 | 0.15 | 14 | 0.04 |
| Example 4 | tartaric acid | 0.038 | hexahydro-1H-1,4-diazepine | 0.021 | DEHA | 0.09 | pyrogallol | 0.0005 | 11 | 0.12 | 10 | 0.04 |
| Example 5 | tartaric acid | 0.038 | 1,4-diazabi-cyclo[2.2.2]octane | 0.021 | DEHA | 0.09 | pyrogallol | 0.0005 | 11 | 0.11 | 12 | 0 |
| Example 6 | tartaric acid | 0.038 | diaza-bicycloundecene | 0.021 | DEHA | 0.09 | pyrogallol | 0.0005 | 11 | 0.14 | 8 | 0.05 |
| Example 7 | tartaric acid | 0.038 | diazabicyclononene | 0.021 | DEHA | 0.09 | pyrogallol | 0.0005 | 11 | 0.13 | 10 | 0.03 |
| Example 8 | tartaric acid | 0.038 | creatinine | 0.021 | DEHA | 0.09 | pyrogallol | 0.0005 | 11 | 0.15 | 7 | 0 |
| Example 9 | tartaric acid | 0.038 | imidazole | 0.021 | DEHA | 0.09 | pyrogallol | 0.0005 | 11 | 0.07 | 5 | 0.02 |
| Example 10 | tartaric acid | 0.038 | 2-mercapto-imidazole | 0.021 | DEHA | 0.09 | pyrogallol | 0.0005 | 11 | 0.14 | 7 | 0.02 |
| Example 11 | tartaric acid | 0.038 | 2,2'-bimidzaole | 0.001 | DEHA | 0.09 | pyrogallol | 0.0005 | 11 | 0.05 | 10 | 0.05 |
| Example 12 | tartaric acid | 0.038 | histamine | 0.002 | DEHA | 0.09 | pyrogallol | 0.0005 | 11 | 0.18 | 11 | 0.03 |
| Example 13 | tartaric acid | 0.038 | pyrazole | 0.021 | DEHA | 0.09 | pyrogallol | 0.0005 | 11 | 0.09 | 10 | 0.02 |
| Example 14 | tartaric acid | 0.038 | 1,2,4-triazole | 0.021 | DEHA | 0.09 | pyrogallol | 0.0005 | 11 | 0.10 | 8 | 0.01 |
| Example 15 | tartaric acid | 0.038 | 3-amino-1,2,4-triazole | 0.021 | DEHA | 0.09 | pyrogallol | 0.0005 | 11 | 0.08 | 9 | 0.05 |
| Example 16 | tartaric acid | 0.038 | 1,2,3-triazole | 0.021 | DEHA | 0.09 | pyrogallol | 0.0005 | 11 | 0.08 | 10 | 0.01 |
| Example 17 | tartaric acid | 0.038 | pyrazine | 0.021 | DEHA | 0.09 | pyrogallol | 0.0005 | 11 | 0.11 | 10 | 0.02 |
| Example 18 | gluconic acid | 0.038 | piperazine | 0.021 | DEHA | 0.09 | pyrogallol | 0.0005 | 11 | 0.11 | 12 | 0.03 |
| Example 19 | galacturonic acid | 0.049 | piperazine | 0.021 | DEHA | 0.09 | pyrogallol | 0.0005 | 11 | 0.08 | 11 | 0.04 |
| Example 20 | tartaric acid | 0.038 | piperazine | 0.021 | DEHA | 0.09 | pyrocatechol | 0.0005 | 11 | 0.19 | 12 | 0.04 |
| Example 21 | tartaric acid | 0.038 | piperazine | 0 021 | DEHA | 0.09 | hydroquinone | 0.0006 | 11 | 0.16 | 11 | 0.03 |
| Example 22 | tartaric acid | 0.038 | piperazine | 0.021 | DEHA | 0.09 | gallic acid | 0.0004 | 11 | 0.15 | 12 | 0.03 |
| Example 23 | tartaric acid | 0.038 | piperazine | 0.021 | DEHA | 0.09 | propyl gallate | 0.0004 | 11 | 0.14 | 12 | 0.04 |

HA: hydroxylamine
HA derivative: hydroxylamine derivative
DEHA: N,N-diethylhydroxylamine

TABLE 2

| | Organic acid | weight % | Amine | weight % | HA or HA derivative | weight % | Oxygen scavenger | weight % | pH | Evaluation method (a) Solubility of Cu$_2$O (ppm) | Evaluation method (b) Residual amount of BTA (ng/cm$^2$) | Evaluation method (c) Potential difference (V) |
|---|---|---|---|---|---|---|---|---|---|---|---|---|
| Comparative Example 1 | tartaric acid | 0.038 | | | DEHA | 0.09 | | | 11 | 0.05 | 36 | 0.25 |
| Comparative Example 2 | tartaric acid | 0.038 | | | DEHA | 0.09 | pyrogallol | 0.0005 | 11 | 0.13 | 32 | 0.05 |
| Comparative Example 3 | tartaric acid | 0.038 | piperazine | 0.021 | DEHA | 0.09 | | | 11 | 0.12 | 13 | 0.26 |
| Comparative Example 4 | | | piperazine | 0.021 | DEHA | 0.09 | pyrogallol | 0.0005 | 11 | 0.11 | 24 | 0.08 |

TABLE 2-continued

| | Organic acid | weight % | Amine | weight % | HA or HA derivative | weight % | Oxygen scavenger | weight % | pH | Evaluation method (a) Solubility of Cu$_2$O (ppm) | Evaluation method (b) Residual amount of BTA (ng/cm$^2$) | Evaluation method (c) Potential difference (V) |
|---|---|---|---|---|---|---|---|---|---|---|---|---|
| Comparative Example 5 | | | N-methyl-piperazine | 0.021 | DEHA | 0.09 | pyrogallol | 0.0005 | 11 | 0.13 | 17 | 0.06 |
| Comparative Example 6 | | | piperazine | 0.021 | DEHA | 0.09 | hydroquinone | 0.0005 | 11 | 0.06 | 24 | 0.17 |
| Comparative Example 7 | | | piperazine | 0.021 | DEHA | 0.09 | gallic acid | 0.0004 | 11 | 0.14 | 22 | 0.18 |
| Comparative Example 8 | | | piperazine | 0.021 | DEHA | 0.09 | propyl gallate | 0.0004 | 11 | 0.13 | 20 | 0.18 |
| Comparative Example 9 | citric acid | 0.038 | piperazine | 0.021 | DEHA | 0.09 | pyrogallol | 0.0005 | 11 | 0.43 | 13 | 0.18 |
| Comparative Example 10 | malic acid | 0.038 | piperazine | 0.021 | DEHA | 0.09 | pyrogallol | 0.0005 | 11 | 0.13 | 16 | 0.16 |
| Comparative Example 11 | oxalic acid | 0.038 | piperazine | 0.001 | DEHA | 0.09 | pyrogallol | 0.0005 | 11 | 0.14 | 13 | 0.10 |
| Comparative Example 12 | glycolic acid | 0.038 | piperazine | 0.002 | DEHA | 0.09 | pyrogallol | 0.0005 | 11 | 0.10 | 20 | 0.12 |
| Comparative Example 13 | malic acid | 0.038 | piperazine | 0.021 | DEHA | 0.09 | pyrogallol | 0.0005 | 11 | 0.20 | 19 | 0.11 |
| Comparative Example 14 | lactic acid | 0.038 | piperazine | 0.021 | DEHA | 0.09 | pyrogallol | 0.0005 | 11 | 0.23 | 14 | 0.10 |
| Comparative Example 15 | histidine | 0.038 | piperazine | 0.021 | DEHA | 0.09 | pyrogallol | 0.0005 | 11 | 0.60 | 6 | 0.06 |
| Comparative Example 16 | glutamic acid | 0.038 | piperazine | 0.021 | DEHA | 0.09 | pyrogallol | 0.0005 | 11 | 1.50 | 11 | 0.07 |
| Comparative Example 17 | citric acid | 0.038 | diazabicycloundecene | 0.021 | DEHA | 0.09 | pyrogallol | 0:0005 | 11 | 0.40 | 13 | 0.10 |
| Comparative Example 18 | maleic acid | 0.038 | diazabicycloundecene | 0.021 | DEHA | 0.09 | pyrogallol | 0.0005 | 11 | 0.14 | 14 | 0.14 |
| Comparative Example 19 | oxalic acid | 0.038 | imidazole | 0.021 | DEHA | 0.09 | pyrogallol | 0.0005 | 11 | 0.14 | 10 | 0.10 |
| Comparative Example 20 | tartaric acid | 0.038 | piperazine | 0.021 | DEHA | 0.09 | ascorbic acid | 0.0005 | 11 | 0.12 | 9 | 0.21 |
| Comparative Example 21 | tartaric acid | 0.038 | piperazine | 0.021 | DEHA | 0.09 | p-aminophenol | 0.0005 | 11 | 0.12 | 17 | 0.18 |
| Comparative Example 22 | tartaric acid | 0.038 | piperazine | 0.021 | DEHA | 0.09 | resorcinol | 0.0005 | 11 | 0.10 | 14 | 0.10 |
| Comparative Example 23 | tartaric acid | 0.038 | piperazine | 0.021 | DEHA | 0.09 | quercelin | 0.0005 | 11 | 0.07 | 15 | 0.10 |
| Comparative Example 24 | tartaric acid | 0.038 | ethylamine | 0.021 | DEHA | 0.09 | pyrogallol | 0.0005 | 11 | 0.17 | 17 | 0.02 |
| Comparative Example 25 | tartaric acid | 0.038 | tetramethyldiaminoethane | 0.021 | DEHA | 0.09 | pyrogallol | 0.0005 | 11 | 0.72 | 9 | — |
| Comparative Example 26 | tartaric acid | 0.038 | pyrrolidine | 0.021 | DEHA | 0.09 | pyrogallol | 0.0005 | 11 | 0.14 | 16 | 0.02 |
| Comparative Example 27 | tartaric acid | 0.038 | pyridine | 0.021 | DEHA | 0.09 | pyrogallol | 0.0005 | 11 | 0.12 | 21 | 0.02 |
| Comparative Example 28 | tartaric acid | 0.038 | ethanolamine | 0.021 | DEHA | 0.09 | pyrogallol | 0.0005 | 11 | 0.67 | 7 | 0.08 |
| Comparative Example 29 | tartaric acid | 0.038 | decahydropyrazine[2,3-b]pyrazine | 0.021 | DEHA | 0.09 | pyrogallol | 0.0005 | 11 | 1.90 | 7 | 0.03 |
| Comparative Example 30 | tartaric acid | 0.038 | piperazine | 0.021 | HA | 0.09 | pyrogallol | 0.0005 | 11 | 0.10 | 10 | 0.06 |

HA: hydroxylamine
HA derivative: hydroxylamine derivative
DEHA: N,N-diethylhydroxylamine A is clear from results of Examples 1 to 23 and Comparative Examples 1 to 30, it has been understood that the cleaning agents of Comparative Example 1 and Comparative Example 2, not containing an amine, are unable to remove sufficiently benzotriazole (benzotriazole itself and a complex between copper (I) and benzotriazole) adhered at the surface of the substrate plated with copper. In addition, it has been understood that the cleaning agents of Comparative Example 1 and Comparative Example 3, not containing an oxygen scavenger, increase potential difference of redox potential (corrosion potential). The cleaning agent having such high potential difference generates bimetallic corrosion (galvanic corrosion) of copper (I) oxide and cobalt (II) oxide, suggesting corrosion of a cobalt-containing film, and it has been understood actually that, although the cleaning agent of Example 6 do not exhibit corrosion of cobalt, the cleaning agents of Comparative Example 4 and Comparative Example 6 exhibit corrosion of cobalt. It has been understood that the cleaning agents of Comparative Examples 4 to 8, not containing an organic acid, are unable to remove sufficiently benzotriazole (benzotriazole itself and a complex between copper (I) and benzotriazole) adhered at the surface of the substrate plated with copper. It has been understood that all of the cleaning agents of Comparative Example 9 to 19, using an organic acid other than the organic acid for the present invention, although containing all of an organic acid, an amine, a hydroxylamine derivative and an oxygen scavenger, increase potential difference of redox potential (corrosion potential), and exhibit excessive dissolution of copper (I) oxide, depending on the cleaning agent, and as a result, the surface of a copper wiring film or the surface of a copper alloy wiring film do not have a sufficient protecting film, which makes the surface of the copper wiring film or the surface of the copper alloy wiring film corroded easily, or are unable to remove sufficiently benzotriazole (benzotriazole itself and a complex between copper (I) and benzotriazole) adhered at the surface of the substrate plated with copper. Still more, it has been understood that the cleaning agents of Comparative Examples 20 to 23, using an oxygen scavenger other than the oxygen scavenger for the present invention, the cleaning agents of Comparative Examples 24 to 29, using an amine other than the amine for the present invention, and the cleaning agent of Comparative Example 30, using hydroxylamine instead of the hydroxylamine derivative, exhibit excessive dissolution of copper (I) oxide, are unable to remove sufficiently benzotriazole (benzotriazole itself and a complex between copper (I) and benzotriazole) adhered at the surface of the substrate plated with copper, or increase potential difference of redox potential (corrosion potential). That is, it has been understood that the cleaning agents of Comparative Examples 1 to 30 are unable to provide the cleaning agent satisfying all of the three performances of time course stability of copper (I) oxide and corrosion suppression capability, removability of benzotriazole, and suppression capability of bimetallic corrosion (galvanic corrosion) of copper (I) oxide and cobalt (II) oxide. On the other hand, it has been understood that the cleaning agents for the semiconductor substrate of the present invention of Examples 1 to 23, that is, the cleaning agents containing, in combination, (A) the organic acid represented by the general formula (1), (B) the amines selected from the group consisting of (B-1) the diamines represented by the general formula (2), (B-2) the amidines represented by the general formula (3), (B-3) the azoles represented by the general formula (4), and (B-A) the pyrazines or the pyrimidines represented by the general formula (5), (C) the hydroxylamine derivative, and (D) the oxygen scavenger represented by the general formula (6) is capable of sufficiently removing fine polishing particles (particles), metal impurities (metal residues) and a coating film (a protecting film) containing an anticorrosive such as benzotriazole or the like, generating at a CMP process; is capable of suppressing corrosion caused by bimetallic corrosion (galvanic corrosion); and a substrate (a wafer) having the surface of the copper wiring film or the surface the copper alloy wiring film protected by a metal oxide composed of copper (I) oxide having sufficient film thickness, can be obtained.

Experimental Example 1

Evaluation of Film Thickness of a Copper (I) Oxide Film, Using the Aqueous Solution (the Cleaning Agent) of Example 1 and the Aqueous Solution (the Cleaning Agent) of Comparative Example 15

Film thickness of copper (I) oxide in the evaluation substrate D was measured, using an atomic force microscope (AFM) (MFP-3D-CF, manufactured by Asylum Technology Co., Ltd.). Next, each 10 mL of the aqueous solution (the cleaning agent) of Example 1 of Table 1 and the aqueous solution (the cleaning agent) of Comparative Example 15 of Table 2 was prepared, and the evaluation substrate D was put into these aqueous solutions (these cleaning agents), and immersed at room temperature for 1 minute under stirring. Film thickness of copper (I) oxide in the evaluation substrate D after immersion was measured, using an atomic force microscope (AFM) (MFP-3D-CF, manufactured by Asylum Technology Co., Ltd.) to calculate amount changed in film thickness (etching amount) between before immersion and after immersion. Results thereof are shown in Table 3.

TABLE 3

| | Before immersion | After immersion | Change in film thickness (Etching amount) |
|---|---|---|---|
| Example 1 | 6.0 nm | 5.6 nm | 0.4 nm |
| Comparative Example 15 | 6.4 nm | 0 nm | 6.4 nm |

As is clear from the results of Table 3, it has been understood that etching amount in the case of using the cleaning agent of Example 1 was 0.4 nm, while etching amount in the case of using the cleaning agent of Comparative Example 15 was 6.4 nm, and there is a big difference in solubility of copper (I) oxide between both cleaning agents. Because the aqueous solution (the cleaning agent) of Example 1 and the aqueous solution (the cleaning agent) of Comparative Example 15 are both capable of sufficiently removing benzotriazole (benzotriazole itself and a complex between copper (I) and benzotriazole) adhered at the surface of the substrate plated with copper, it is guessed that these cleaning agents have different removal mechanism of benzotriazole adhered at the surface of the substrate plated with copper. That is, it is considered that removal mechanism of the cleaning agent of Comparative Example 15 is a mechanism for removing benzotriazole together with copper (I) oxide by dissolving copper (I) oxide present at a lower layer of benzotriazole, while removal mechanism of the cleaning agent of Example 1 is a mechanism for removing only benzotriazole without removing copper (I) oxide. Accordingly, it has been understood that the cleaning agent of Comparative Example 15, which removes benzotriazole together with copper (I) oxide, results in not providing a metal oxide (a protecting film) composed of copper (I) oxide having sufficient film thickness, and thus deteriorates time course stability of a copper wiring film or a copper alloy wiring film. On the other hand, it has been understood that the cleaning agent for the semiconductor substrate of the present invention, such as the cleaning agent of Example 1, which is capable of removing only benzotriazole, without removing copper (I) oxide, is capable of providing a metal oxide (a protecting film) composed of copper (I) oxide having sufficient film thickness, which therefore provides high time course stability of a copper wiring film or a copper alloy wiring film, resulting in providing a semiconductor substrate which little generates short circuit between the copper wiring and the copper alloy wiring.

As is clear from the above results, it has been understood that the cleaning agent for the semiconductor substrate of the present invention provides a semiconductor substrate having high time course stability of a copper wiring film or a copper alloy wiring film, and thus provides a semiconductor substrate which little generates short circuit between the copper wiring film or the copper alloy wiring film, because (1) it is capable of sufficiently removing fine polishing particles (particles), metal impurities (metal residues) and a coating film (a protecting film) containing an anticorrosive such as BTA or the like, generating at a CMP process; (2) potential difference of redox potential (corrosion potential) between copper (I) oxide and cobalt (II) oxide is small, and thus it little generates bimetallic corrosion (galvanic corrosion) of copper (I) oxide and cobalt (II) oxide, resulting in suppressing corrosion of cobalt (II) oxide and metallic cobalt (0); and (3) it removes a coating film (a protecting film) containing an anticorrosive such as BTA or the like, almost without removing a metal oxide (a protecting film) composed of copper (I) oxide, and it little dissolves the metal oxide (the protecting film) composed of copper (I) oxide exposed at the surface after removing the coating film (the protecting film). From these results, it has been understood that the cleaning agent for the semiconductor substrate of the present invention is a preferable cleaning agent as a cleaning agent to be used in a cleaning post-process of a CMP process.

INDUSTRIAL APPLICABILITY

The cleaning agent for the semiconductor substrate of the present invention is a cleaning agent to be used in a post-process of a CMP process in a manufacturing process of a semiconductor substrate, and is, particularly, a cleaning agent to be used as a cleaning agent after a CMP of a semiconductor substrate having a copper wiring film or a copper alloy wiring film, and a cobalt-containing film at the surface of the semiconductor substrate.

The processing method of the surface of the semiconductor substrate of the present invention is a method for cleaning a semiconductor substrate having a copper wiring film or a copper alloy wiring film, and a cobalt-containing film, after a CMP process; and a method capable of cleaning the surface of a semiconductor substrate, while suppressing corrosion of cobalt (II) oxide and metallic cobalt (0), caused by bimetallic corrosion (galvanic corrosion) of copper (I) oxide and cobalt (II) oxide, in particular, in the case where the cobalt-containing film is a thin film-type barrier metal.

The invention claimed is:

1. A cleaning agent for a semiconductor substrate having a copper wiring film or a copper alloy wiring film, and a cobalt-containing film to be used in a post-process of a chemical mechanical polishing process, comprising (A) an organic acid represented by general formula (1), (B) piperazine, (C) a hydroxylamine derivative, and (D) an oxygen scavenger represented by general formula (6); and being an aqueous solution having a pH of 10 or higher:

(1)

wherein $R^1$ represents a carboxyl group, a 1,2,3-trihydroxypropyl group or a 3-oxo-1,2-dihydroxypropyl group;

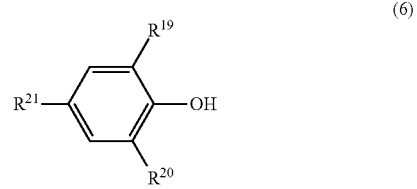

(6)

wherein $R^{19}$ represents a hydrogen atom or a hydroxyl group, $R^{20}$ represents a hydrogen atom or a hydroxyl group, $R^{21}$ represents a hydrogen atom, a hydroxyl group, a carboxyl group or a propoxycarbonyl group, provided that at least one of $R^{19}$ to $R^{21}$ represents a hydroxyl group.

2. The cleaning agent according to claim 1, wherein (A) the organic acid represented by general formula (1) is an organic acid selected from tartaric acid, gluconic acid. and galacturonic acid.

3. The cleaning agent according to claim 1, wherein (A) the organic acid represented by general formula (1) is tartaric acid.

4. The cleaning agent according to claim 1, wherein (C) the hydroxylamine derivative is a hydroxylamine derivative represented by general formula (7):

(7)

wherein $R^{22}$ represents an alkyl group having 1 to 6 carbon atoms, and $R^{23}$ represents a hydrogen atom or an alkyl group having 1 to 6 carbon atoms.

5. The cleaning agent according to claim 1, wherein (D) the oxygen scavenger represented by general formula (6) is an oxygen scavenger selected from pyrogallol, pyrocatechol, hydroquinone, gallic acid and propyl gallate.

6. The cleaning agent according to claim 1, wherein (D) the oxygen scavenger represented by general formula (6) is pyrogallol.

7. The cleaning agent according to claim 1, wherein the cleaning agent further comprises (E) an alkali compound.

8. The cleaning agent according to claim 7, wherein (E) the alkali compound is a quaternary ammonium salt.

9. The cleaning agent according to claim 1, wherein pH is 10 to 13.

10. The cleaning agent according to claim 1, comprising 0.001 to 5% by weight of (A) the organic acid represented by general formula (1),0.0005 to 5% by weight of (B) piperazine, 0.01 to 25% by weight of (C) the hydroxylamine derivative, and 0.0001 to 1% by weight of (D) the oxygen scavenger represented by general formula (6).

11. The cleaning agent according to claim 10, wherein the cleaning agent further comprises 0.1 to 5% by weight of (E) the alkali compound.

12. The cleaning agent according to claim 7 consisting of (A) the organic acid represented by general formula (1), (B) piperazine, (C) the hydroxylamine derivative, (D) the oxygen scavenger represented by general formula (6), (E) the alkali compound, and water.

13. The cleaning agent according to claim 1, wherein the cobalt-containing film is a barrier metal of the copper wiring film or the copper alloy wiring film.

14. A processing method for the surface of a semiconductor substrate, having a copper wiring film or a copper alloy wiring film, and a cobalt-containing film, which comprises using the cleaning agent according to claim 1.

15. The processing method according to claim 14, wherein the cobalt-containing film is a barrier metal of the copper wiring film or the copper alloy wiring film.

16. The processing method according to claim 14, wherein the semiconductor substrate is a substrate after chemical mechanical polishing.

17. The processing method according to claim 14, wherein the processing method is a method for removing a coating film at the surface of the copper wiring film or the surface of the copper alloy wiring film, derived from benzotriazole or a derivative thereof.

* * * * *